(12) United States Patent
Orr et al.

(10) Patent No.: US 6,788,148 B2
(45) Date of Patent: Sep. 7, 2004

(54) VOLTAGE-LIMITED DISTRIBUTED CURRENT SOURCE FOR ULTRA-BROADBAND IMPEDANCE TERMINATION

(75) Inventors: Jerry Orr, Santa Rosa, CA (US); Sean Pham, Sunnyvale, CA (US); Jeffrey W. Meyer, Santa Rosa, CA (US)

(73) Assignee: Centellax, Inc., Santa Rosa, CA (US)

( * ) Notice: Subject to any disclaimer, the term of this patent is extended or adjusted under 35 U.S.C. 154(b) by 15 days.

(21) Appl. No.: 10/382,714

(22) Filed: Mar. 5, 2003

(65) Prior Publication Data

US 2003/0184384 A1 Oct. 2, 2003

Related U.S. Application Data

(60) Provisional application No. 60/363,059, filed on Mar. 11, 2002.

(51) Int. Cl.[7] .............................. H03F 3/60; H03F 3/68; H03F 3/04; H03K 19/003
(52) U.S. Cl. ....................... 330/286; 330/295; 330/296; 326/30; 326/21
(58) Field of Search ..................... 326/30, 21; 330/286, 330/295, 296

(56) References Cited

U.S. PATENT DOCUMENTS

| | | | | |
|---|---|---|---|---|
| 4,853,649 A | * | 8/1989 | Seino et al. | ................. 330/277 |
| 5,349,306 A | * | 9/1994 | Apel | ........................... 330/277 |
| 6,377,125 B1 | * | 4/2002 | Pavio et al. | ................. 330/286 |

FOREIGN PATENT DOCUMENTS

| JP | 54136259 A | * 10/1979 | ............. H03F/1/26 |
|---|---|---|---|

* cited by examiner

*Primary Examiner*—James H. Cho
(74) *Attorney, Agent, or Firm*—Fenwick & West LLP

(57) ABSTRACT

A termination network simultaneously provides a voltage-limited output direct current (dc) bias and termination of a broadband distributed amplifier operating down to an arbitrary low frequency. It is capable of being fabricated in a single Integrated Circuit (IC) chip, without the excess power dissipation associated with biasing through a termination resistor, and without the use of external inductor networks. It also limits the maximum dynamic voltage swing on the outputs of the active gain devices used within the distributed amplifier, so as to increase the reliability of the distributed amplifier under large signal over drive conditions.

77 Claims, 18 Drawing Sheets

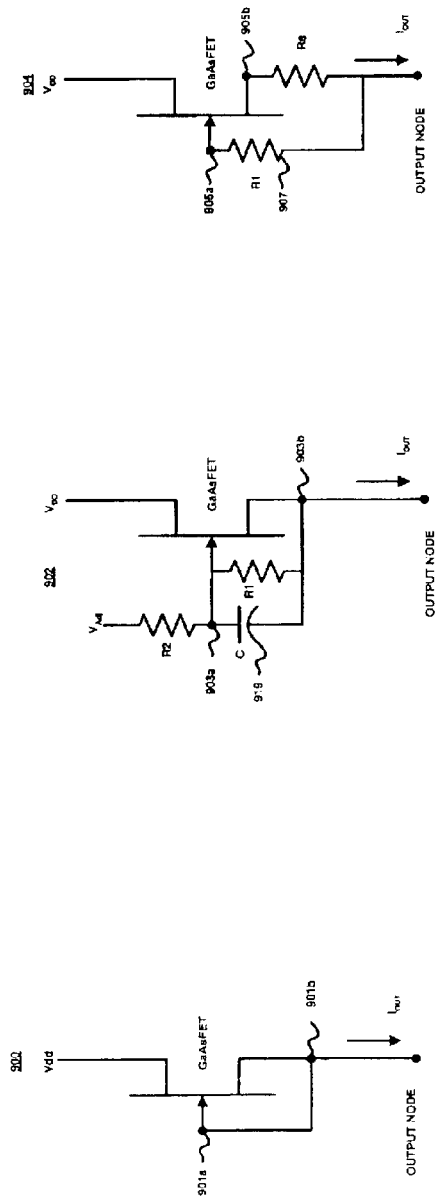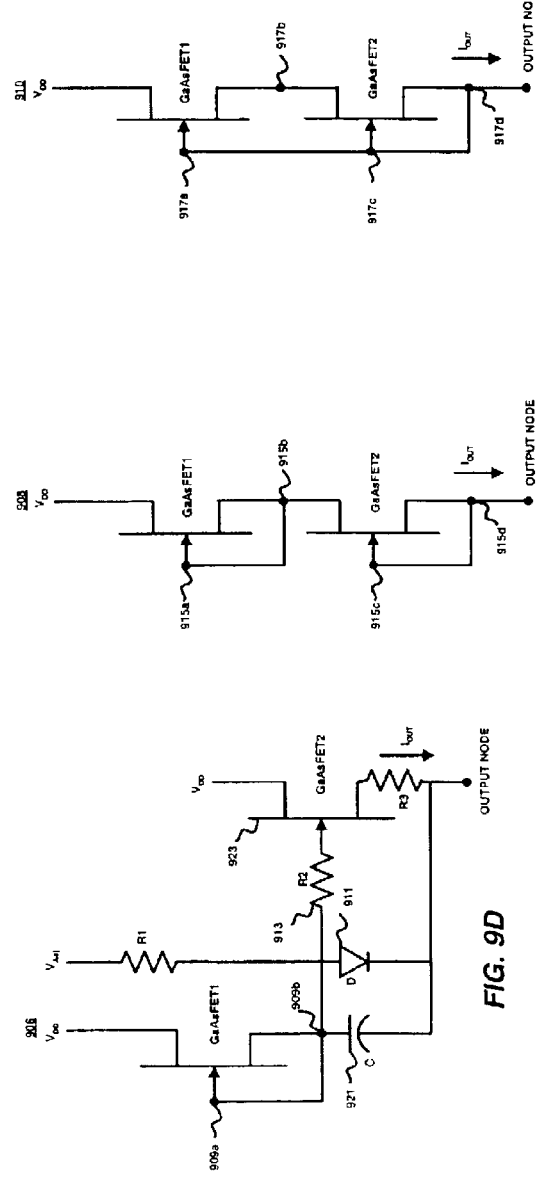
FIG. 9A FIG. 9B FIG. 9C FIG. 9D FIG. 9E FIG. 9F

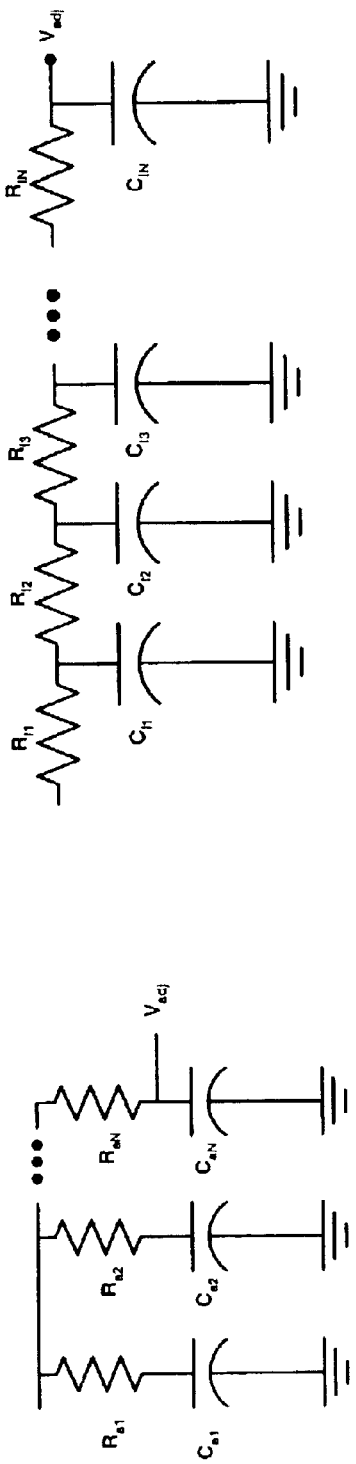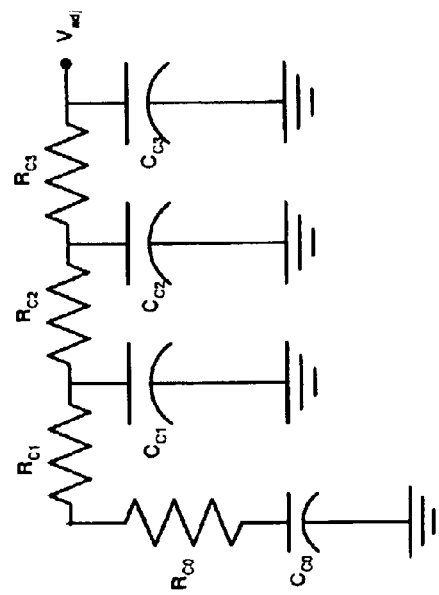
FIG. 12B
FIG. 12C
FIG. 12A

VOLTAGE-LIMITED DISTRIBUTED CURRENT SOURCE FOR ULTRA-BROADBAND IMPEDANCE TERMINATION

CROSS-REFERENCE TO RELATED APPLICATIONS

This application claims the benefit of U.S. Provisional Application No. 60/363,059, filed Mar. 11, 2002, which application is incorporated by reference herein.

BACKGROUND

1. Field of the Invention

The present invention relates to the field of electronic components for optical and broadband communication systems, and in particular, to techniques implemented in integrated circuit (IC) technology for biasing and terminating the output of a broadband distributed amplifier.

2. Background

Distributed amplifiers are multi-stage amplifiers used in optical and broadband communication systems to amplify signals over a broad frequency band, including frequencies below 500 MHz. Distributed amplifiers require their input and output lines to be terminated by a load impedance equal to the characteristic impedance of each line to maximize power transfer from the distributed amplifier to the load. Preferably, this terminating load impedance (hereinafter also referred to as "impedance termination") provides constant impedance over the entire frequency range of operation of the distributed amplifier. The impedance termination also provides direct current (dc) biases to the active gain devices in the distributed amplifier used to amplify signals. One such active gain device is the Field Effect Transistor (FET), which typically requires dc biases applied to its input terminals (e.g., gate, base) and to its output terminals (e.g., drain, collector) to place the device in an amplifying state.

Biasing the input lines of a distributed amplifier is typically not a problem, because the input terminals of the active gain devices, which make up the distributed amplifier, use little input bias current as compared to output bias current. The input bias current is also small compared to the input line impedance of the distributed amplifier. Thus, a dc bias can be applied to the input line of a distribute amplifier directly through a termination resistor without excessive power dissipation.

By contrast, it is not simple to design the impedance termination for a distributed amplifier using IC technology when the amplifier has to operate at frequencies below 500 MHz. For example, it is difficult to maintain constant output impedance termination while providing dc bias to the output terminals of the active gain devices in the distributed amplifier. This is because the output terminals of the active gain devices draw a significant amount of bias current.

One conventional solution is to provide the impedance termination on chip, and to bring the de bias through an internal inductor or an external biasing choke network. The use of an internal inductor is not an ideal solution when the lowest frequency of operation of the distributed amplifier is below 500 MHz because the size of the inductor is too large to realize on chip. A large internal inductor tends to have series resonance that limits the maximum frequency range of the distributed amplifier.

Alternatively, an external choke can be implemented as a single large inductor off chip when the lowest frequency of operation is above 50 MHz. An external choke, however, is also not an ideal solution because of the high cost of manufacturing a suitable inductor (e.g., one that is free of spurious series resonance from 50 MHz to greater than GHz). Additionally, because such inductors are physically large and of an awkward shape they are difficult to mechanically mount inside a microcircuit package next to a distributed amplifier IC using automated assembly equipment. This means they must be assembled by hand, which adds significantly to the cost of the packaged distributed amplifier assembly.

When the amplifier is required to operate at frequencies below 50 MHz, as is often the case in optical communication systems, one inductor is usually not enough. For such an amplifier, a more complicated network can be used, such as the network described in V. Kaman, T. Reynolds, A. Petersen, J. E. Bowers, "A 100 KHz to 50 GHz Traveling-Wave Amplifier IC Module," IEEE Microwave and Guided Wave Letters, Vol. 9, Section 10, pp. 416–418, October (1999). While this network can achieve the required performance without adding any extra dc power dissipation, it is expensive to implement. Indeed, it may be more than twice as expensive as the single inductor method used down to 50 MHz, because it requires at least two physically large inductors, which must be mechanically supported, and which require even more expensive hand assembly.

Another common solution is to provide the dc bias to the output line of the distributed amplifier through a reverse termination resistor. This method of providing the dc bias to the output line dissipates excess power on chip. For example, a broadband amplifier which can drive 8 Volts (peak-to-peak) into a 50 Ohm load is typically biased at about 8 Volts with 250 mA of collector current, and dissipates 2 Watts of dc power when biased using a large inductor, as previously discussed. The most common output line characteristic impedance for optical and broadband applications is 50 Ohms. If one were to provide the output bias through a 50 Ω termination resistor in the above example, the amplifier would have to be biased at about 20.5 Volts instead of 8 Volts. This allows for 12.5 Volts (250 mA*50 Ω=12.5 V) voltage drop across the biasing resistor, and leads to over 5 Watts of power dissipation, most of which is being dissipated in the reverse termination resistor. Besides the power dissipation, the reverse termination resistor has to be physically large to pass 250 mA of collector current.

There are several problems associated with implementing large termination resistors on chip. Such resistors are typically implemented as large thin film resistors, which have a large shunt capacitance and limited current handling capability. Many IC foundries have stringent limits on the current handling capability of thin film resistors. To avoid this problem a special thin film resistor process can be requested, which handles twice-as much current (e.g., using a lower Ω/sq thin film of extra thickness), but typically costs more to fabricate.

Accordingly, there is a need for an impedance termination that can simultaneously provide voltage-limited output dc bias and proper termination of a broadband distributed amplifier, operating down to an arbitrary low frequency. It should be capable of being fabricated in a single IC chip, without the excess power dissipation associated with biasing through a reverse termination resistor, and without the use of external biasing chokes. It should also limit the maximum dynamic voltage swing on the outputs of the active gain devices used within the distributed amplifier, so as to significantly increase the reliability of the distributed amplifier under large signal over drive conditions.

SUMMARY OF THE INVENTION

The present invention overcomes the deficiencies of conventional circuits and techniques by integrating or otherwise connecting a voltage-limited distributed current source with an integrated circuit (e.g., a distributed amplifier, broadband amplifier, mixer, oscillator, etc.) to provide biasing and termination impedance for the integrated circuit.

In one embodiment of the present invention, an integrated circuit device comprises an integrated circuit (e.g., a distributed amplifier) having input and output lines connected to a distributed current source. The integrated circuit includes one or more gain devices connected to the output line. The distributed current source includes one or more current sources connected to the output line and the gain devices. A frequency dependent termination network is connected to the output line for providing a termination impedance and a sensing device for sensing a change in bias voltage on the output line.

In one embodiment of the present invention, an integrated circuit (e.g., a distributed amplifier) having input and output lines is connected to a termination network including at least one current source and a sensing device for sensing a change in output bias voltage on the output line.

In one embodiment of the present invention, an integrated circuit device comprises an integrated circuit (e.g., a distributed amplifier) having input and output lines connected to a distributed current source. The integrated circuit includes one or more gain devices connected to the output line. The distributed current source includes one or more current sources connected to the output line and the one or more gain devices. A termination network is connected to the output line and includes at least one current source and a sensing device for sensing a change in output bias voltage on the output line.

The frequency dependent termination network for each of the foregoing embodiments can include a bias control loop connected to the output line for automatically adjusting the bias voltage on the output line. The termination networks can include various frequency dependent termination loads, including but not limited to one or more resistor-capacitor (RC) networks in star and ladder configurations or a combination of star and ladder RC networks. The termination network can also include one or more M-derived matching inductor-capacitor (LC) sections.

A delay section can be inserted in the input and/or output lines to control phase delays in the input and output lines. In one embodiment of the present invention, one or more layers of resistive film material (e.g., TFR film, bulk resistor layer) can be disposed under the input and/or output lines to increase the loss along the lines. Also, the shunt conductance of each current source can be increased at high frequencies by adding an additional RC network in shunt with each current source. To reduce jitter the distributed current sources can be configured as a Tee or Pi attenuators by connecting the current sources in shunt with one or more series resistors, which are connected in series with one or more matching inductors.

The present invention also includes various embodiments of current sources. One or more of these current sources can be a depletion mode load style current source. The current sources can include one or more of the following: a capacitive element to reduce capacitance of the current source, a resistive element to suppress oscillations in output current due to process variations, a capacitive element to maintain constant voltage at higher frequencies, and a diode for forward biasing gain devices. The currents sources can also use negative conductance to compensate for losses down the output line of the integrated circuit, such as a distributed amplifier.

The present invention can be fabricated in a single integrated circuit chip without the excess power dissipation associated with supplying the bias current through an output reverse termination resistor, and without the use of an expensive off chip biasing choke. The present invention also limits the maximum dynamic voltage swing on the outputs of the active gain devices used within the distributed amplifier, thereby increasing the reliability of the distributed amplifier under large signal over drive conditions.

BRIEF DESCRIPTION OF THE DRAWINGS

FIGS. 9A–F are circuit diagrams of depletion mode load style current sources for use in a distributed current source, in accordance with the present invention.

FIGS. 12A–C are circuit diagrams of frequency dependent termination impedance networks, in accordance with the present invention.

DETAILED DESCRIPTION OF EMBODIMENTS

The present invention is described below using symbols and nomenclature known to those skilled in the art of integrated circuit technology. Like elements are collectively designated by a single numerical designation, and individual elements within the numerically designated set of elements are designated alphanumerically. For example, elements "a" and "b" are referred to collectively as elements 100 or 100a–b and individually as element 100a and element 100b.

The semiconductor devices described in the embodiments below can be any type of known device, including without limitation, Bipolar Junction Transistors (BJTs), Field Effect Transistors (FETs), Pseudomorphic high electron mobility (pHEMPTs), Dual Gate Devices, and Cascode Pairs. These devices can be made of any material, including without limitation, Silicon (Si), Gallium Arsenide (GaAs), Indium Phosphate (InPh), and Gallium Nitride (GaN).

Distributed Current Source Model

Figure 1:
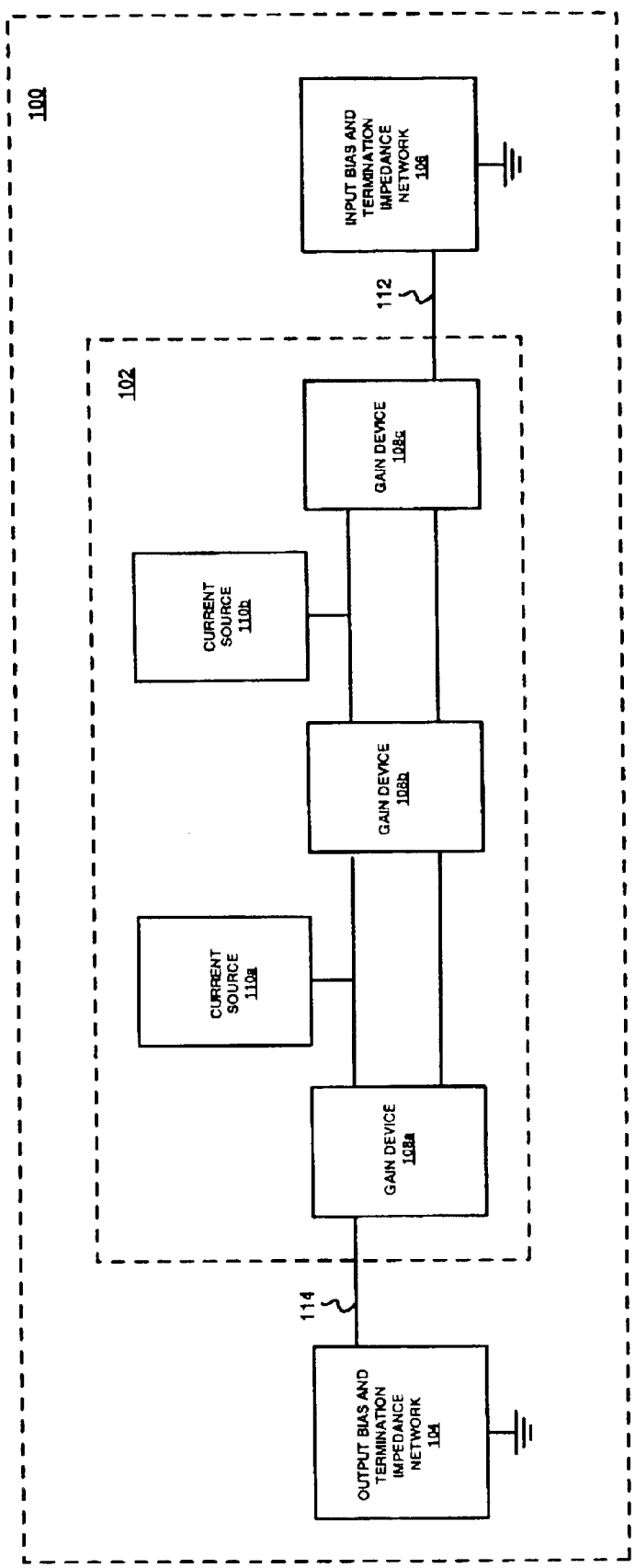
FIG. 1 is a block diagram of an integrated circuit including a distributed amplifier and an output bias and termination impedance network, in accordance with one embodiment of the present invention.

FIG. 1 is a block diagram of an integrated circuit (IC) 100 including a distributed amplifier 102, an output bias and termination impedance network 104, and an input bias and termination impedance network 106, in accordance with one embodiment of the present invention. The distributed amplifier 102 includes gain devices 108a–c (e.g., FET, BJT, pHEMPT), which are used to amplify input signals received from input transmission line 112. While only three gain devices are shown in FIG. 1, any number of gain devices can be used with the present invention.

The output bias and impedance termination network 104 ("termination network 104") is connected to the distributed amplifier 102 via an output transmission line 114 to provide dc biases to the outputs of the active gain devices 108a–c and a terminating load impedance that is substantially constant over the entire frequency range of operation of the distributed amplifier 102. In one embodiment of the present invention, current sources 110a–b are connected to the output transmission line 114 and interleaved with the gain devices 108a–c to provide the dc bias current to the outputs (e.g., collectors, drains, etc.) of the gain devices 108a–c, as described more fully with respect to FIG. 2 below.

Figure 2A:
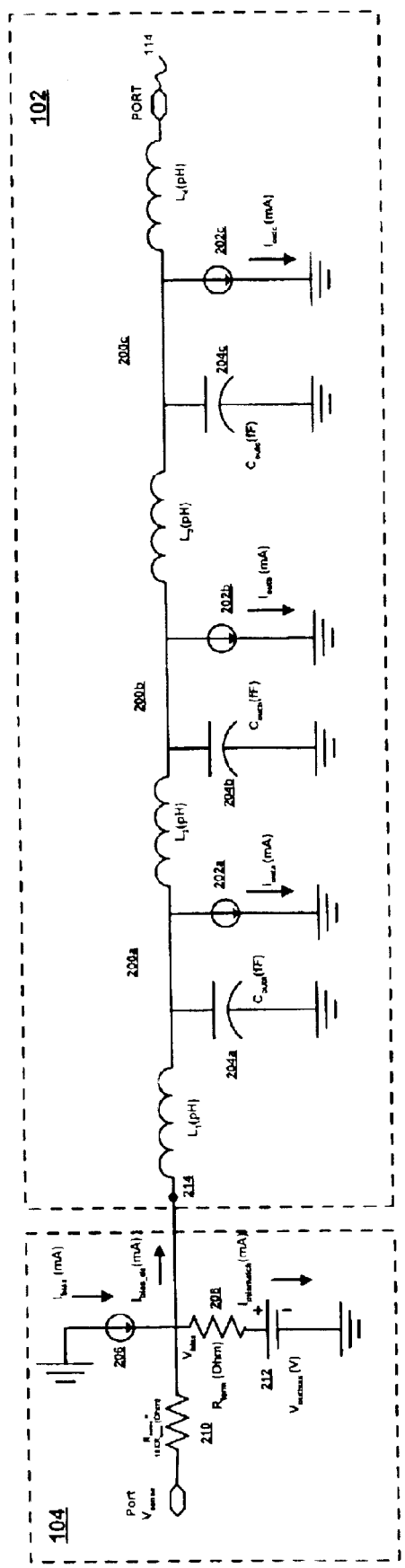
FIG. 2A is a circuit model of the distributed amplifier and the output bias termination impedance network shown in FIG. 1, in accordance with one embodiment of the present invention.
Figure 2B:
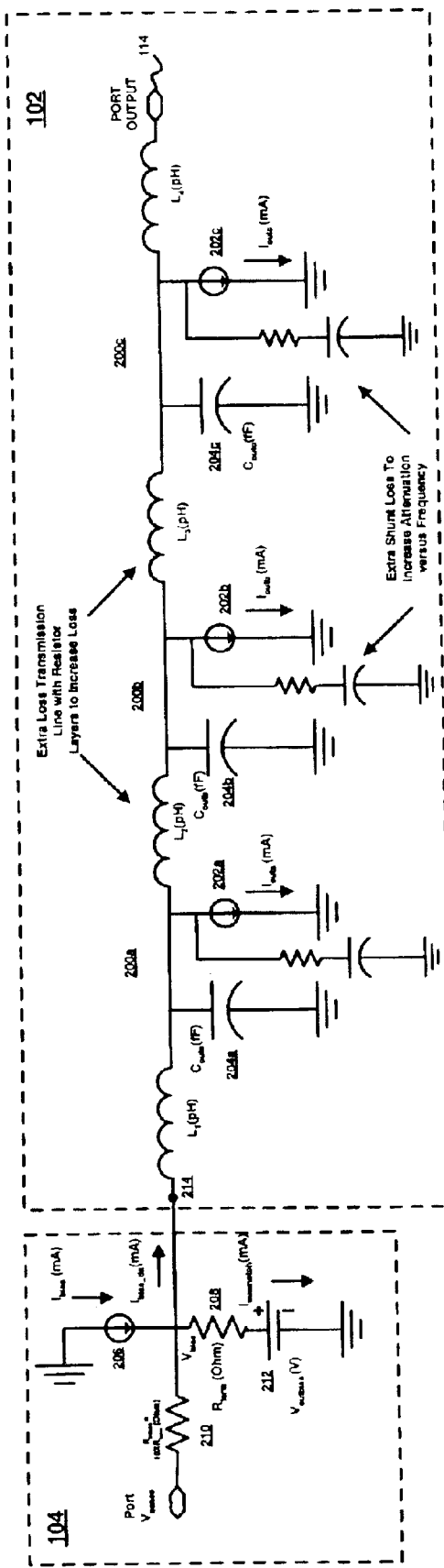
FIG. 2B is a circuit model of the distributed amplifier and the output bias termination impedance network shown in FIG. 1 with extra shunt loss and extra lossy transmission lines, in accordance with one embodiment of the present invention.

FIGS. 2A–2B are circuit model diagrams of the distributed amplifier 102 connected to the termination network 104 shown in FIG. 1, in accordance with one embodiment of the present invention. For clarity purposes, only the outputs 200a–c (e.g., collector, drain, etc.) of the gain devices 108a–c of the distributed amplifier 102 are modeled in FIGS. 2A–2B. The outputs 200a–c are modeled as controlled current sources 202a–c connected in shunt with output capacitances 204a–c. The current sources 202a–c and capacitances 204a–c are connected to the output transmission line 114.

The termination network 104 comprises a bias current source 206, a reverse termination resistor 208, a sense resistor 210 and a dc voltage source 212. The bias current source 206 is connected in shunt with the reverse termination resistor 208, and provides a biasing current $I_{bias}$ to the outputs 200a–c. If the biasing current $I_{bias}$ does not match the current $I_{bias\_da}$ drawn by the outputs 200a–c, then the bias voltage $V_{bias}$ at node 214 will tend to rail. The current mismatch $I_{mismatch}$ causes a voltage drop across the sense resistor 210, which can be measured and used to adjust the voltage across the reverse termination resistor 208 using voltage source 212. The bias current source 206 replaces the external rf choke used in conventional output termination networks for distributed amplifiers.

In one embodiment of the present invention, one or more layers of resistive film material (e.g., TFR film, bulk resistor layer) can be disposed under the transmission line 114 to increase the loss. Also, the shunt conductance of each current source can be increased at high frequencies by adding an additional RC network in shunt with each current source, as shown in FIG. 2B.

While the termination network 104 shown in FIGS. 2A–2B can be used to terminate the output of a distributed amplifier, the termination network 104 can also provide the bias current and the load termination concurrently for other types of circuits, including but not limited to broadband amplifiers, mixers, oscillators, and any other circuit that could benefit from bias current and load termination.

Automatic Bias Control

Figure 3:
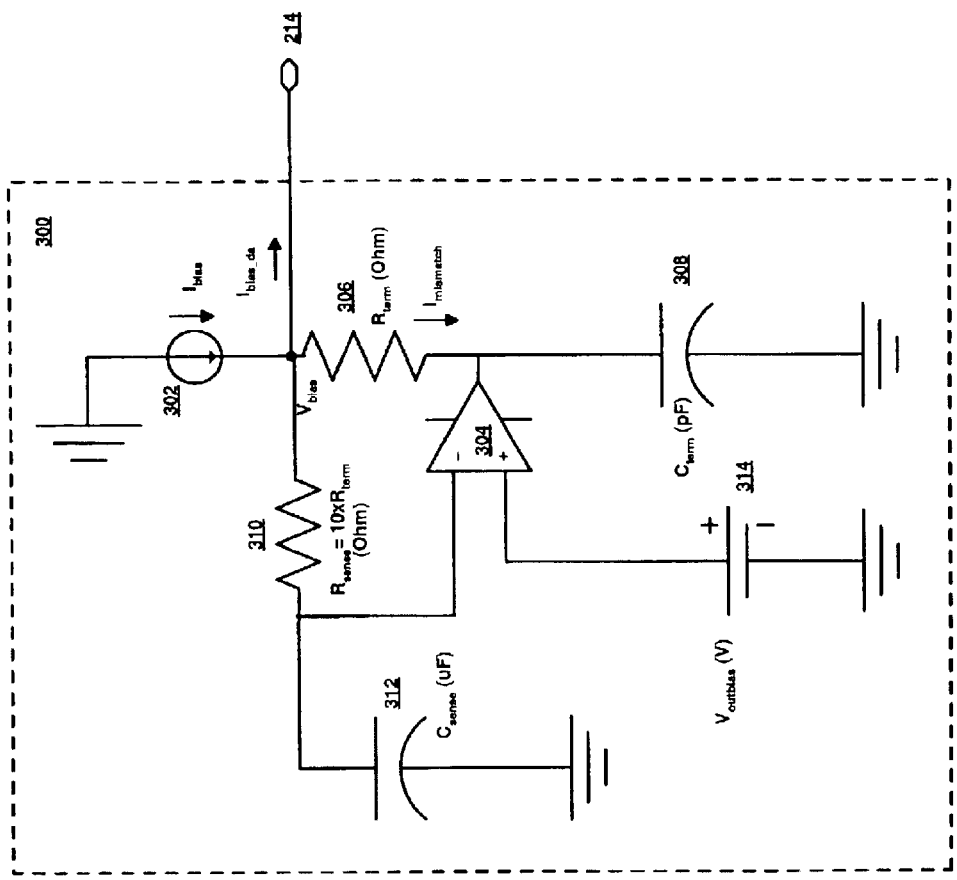
FIG. 3 is a circuit diagram of a frequency dependent output bias and termination impedance network having an automatic bias control loop, in accordance with one embodiment of the present invention.

FIG. 3 is a circuit diagram of a frequency dependent output bias and termination impedance network 300 ("termination network 300") having an automatic bias control loop, in accordance with one embodiment of the present invention. The termination network 300 is another embodiment of the termination network 104 and can be connected to node 214 of the distributed amplifier 102 shown in FIG. 2.

The termination network 300 comprises a bias current source 302, a comparing device 304 (e.g., operational amplifier), a reverse termination resistor 306, a reverse termination capacitor 308, a sense resistor 310, a sense capacitor 312, and a dc voltage source 314. The values for these devices can be selected to provide a desired frequency response (e.g., 30 KHz). The reverse termination resistor 306, the sense resistor 310 and the comparing device 304 are configured to function as a bias control loop for maintaining a desired dc bias voltage $V_{bias}$ at node 214 over temperature variations and through aging of the gain devices 108a–c. The bias current source 302 is connected in shunt with the reverse termination resistor 306, and provides a biasing current $I_{bias}$ to the distributed amplifier 102 via node 214. If the biasing current $I_{bias}$ does not match the current $I_{bias\_da}$ drawn by the outputs 200a–c of the gain devices 108a–c in the distributed amplifier 102, then the bias voltage $V_{bias}$ at node 214 will tend to rail. The current mismatch $I_{mismatch}$ is sensed by the comparing device 304, which balances the currents $I_{bias}$ and $I_{bias\_da}$ by adjusting the bias voltage $V_{bias}$ at node 214 to the desired value using voltage source 314.

The termination network 300 can be auto-inserted and auto-assembled during the IC fabrication process, thus eliminating the need for costly hand assembly typically required with conventional circuits and techniques.

Reducing the Effect of Parasitic Output Capacitance

While the interleaving of a distributed current source into the output bias network of a distributed amplifier is conceptually straight forward, realizing an ideal current source on an IC chip at high frequencies is difficult to achieve in practice. Practical current sources that can be realized in conventional IC processes typically have parasitic output capacitance, finite output resistance, and limited dynamic range.

Figure 4:
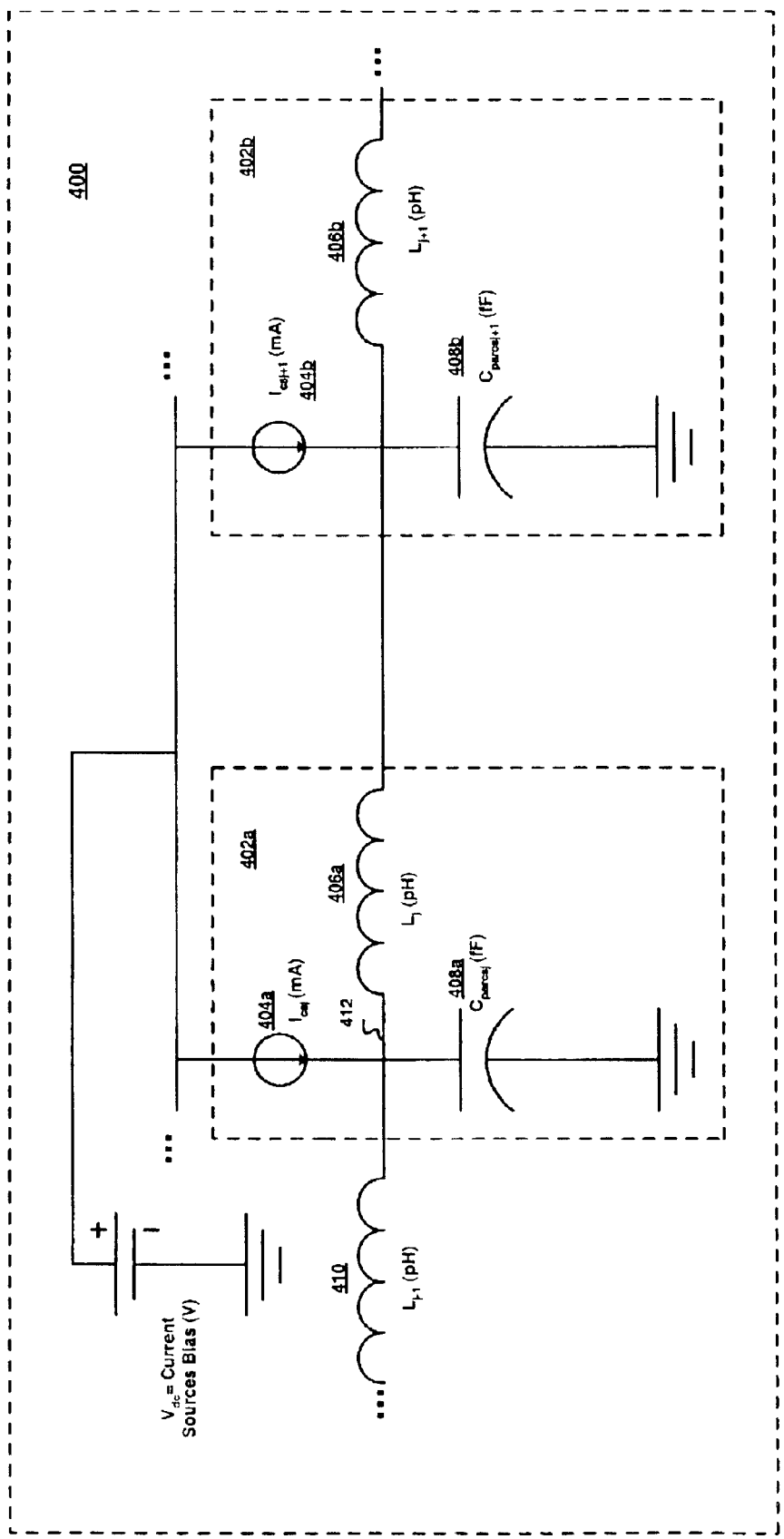
FIG. 4 is a circuit model of two adjacent sections of a distributed current source, in accordance with one embodiment of the present invention.

The parasitic output capacitance associated with a practical on chip active current source can be modeled by distributing the capacitance over two or more sections of the distributed current source. FIG. 4 is a circuit model of a "jth" section 402a and "jth+1" section 402b of a distributed current source 400, in accordance with one embodiment of the present invention. The jth section 402a is modeled as a fixed current source 404a connected to a shunt parasitic capacitance 408a ($C_{parcsj}$) and the jth+1 section 402b is modeled as a fixed current source 404b connected to a shunt capacitance 408b ($C_{parcsj+1}$). The sizes of the jth and jth+1 sections 402a, 402b, in the distributed current source 400 need not be the same. Small elemental inductances 406a ($L_j$) and 406b ($L_{j+1}$) are inserted into an artificial transmission line 412 between sections 402a, 402b, forming an artificial line low-pass filter, which absorbs the parasitic capacitance 408a.

In practice, the elemental inductances 406a, 406b, are realized using a small length of high impedance transmission line. The image impedance $Z_i$ and corner frequency $F_c$ of the "ith" stage of a distributed amplifier can be represented mathematically by equations (1) and (2), as follows:

$$Z_i = \sqrt{\frac{L_{j-1} + L_j}{2 C_{parcsj}}}, \tag{1}$$

$$F_c = \frac{1}{\pi \sqrt{\frac{L_{j-1} + L_j}{2} * C_{parcsj}}} \tag{2}$$

It is noted from equations (1) and (2), that the image impedance $Z_i$ and the corner frequency $F_c$ are functions of the elemental inductance 410 ($L_{j-1}$) from the "j-1th" section of the distributed current source 400 and the elemental inductance 406a ($L_j$) and capacitance 408a ($C_{paracsj}$) of the "jth" section 402a.

The techniques described above are used with distributed current sources to reduce the effects of shunt parasitic capacitance on the frequency response of a distributed amplifier. Equations (1) and (2) generally describe how the capacitances of the current sources of the biasing network or the capacitances of the gain devices of the distributed amplifier are absorbed into an artificial transmission line with an arbitrary bandwidth with corner frequency $F_c$.

Distributed Current Source Integrated With Distributed Amplifier

Figure 5:
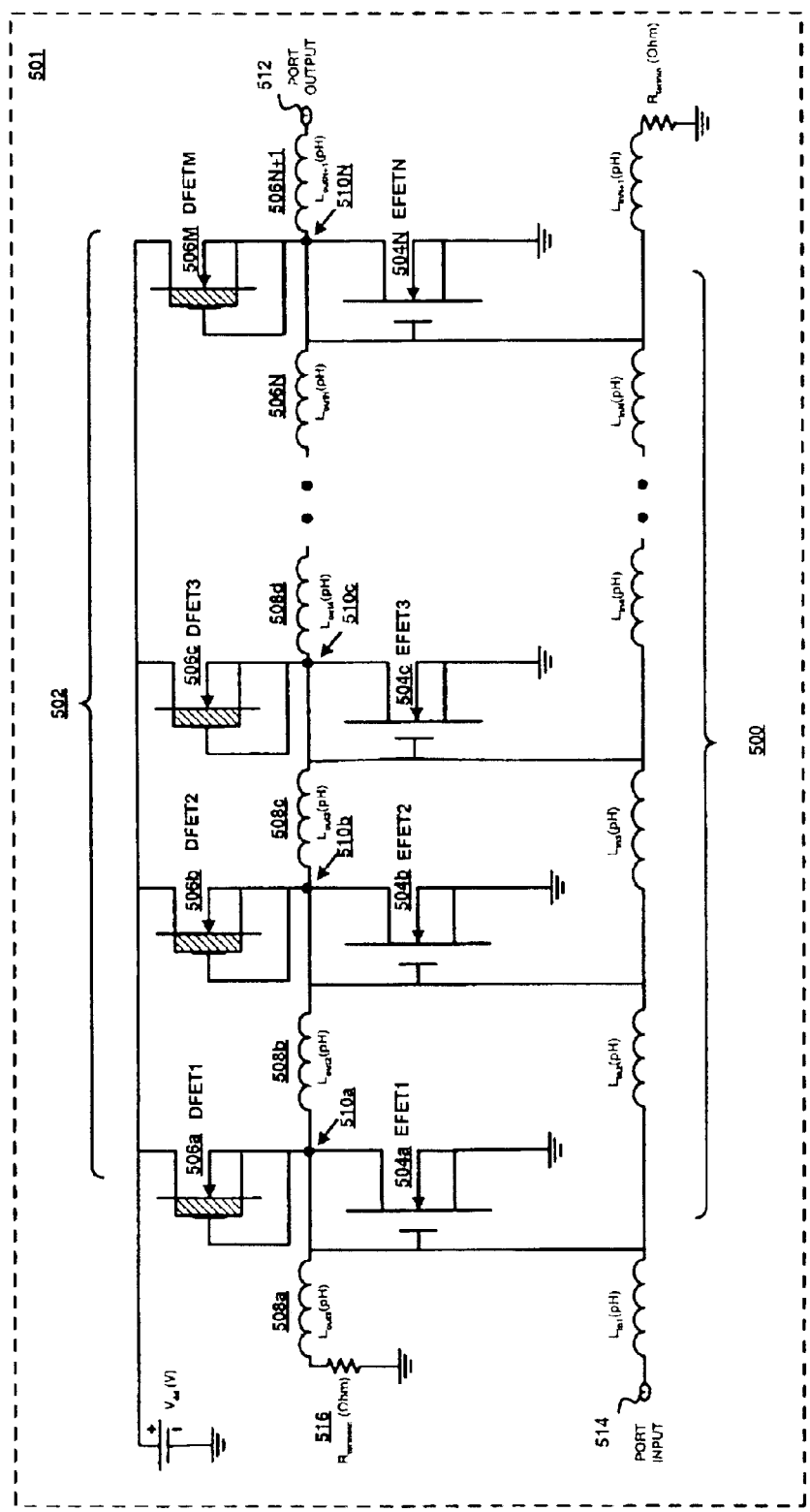
FIG. 5 is a circuit diagram of an N section distributed amplifier integrated with a distributed current source.

FIG. 5 is a circuit diagram of an integrated circuit 501, including an N section distributed amplifier 500 integrated with a distributed current source 502. The distributed current source 502 is in shunt with a reverse termination resistor 516 to simultaneously provide dc bias and proper impedance termination. The distributed amplifier 500 is realized on an IC chip and comprises gain devices 504a-N (e.g., ED-MOS or CMOS digital inverter gates), where each gain device 504a-N can be an E-type, pull-down active gain device. The distributed current source 502 comprises current sources 506a-M (e.g., ED-MOS or CMOS digital inverter gates) integrated with the gain devices 504a-N, where each current source 506a-M can be a D-type, pull-down active current source. Inductor elements 508a-N are preferably inserted into output transmission line 512 between nodes 510a-N, and are shared by the gain devices 504a-N and the current sources 506a-M. As discussed previously with respect to FIG. 4, the inductor elements absorb the shunt parasitic capacitance contributed by the current sources 506a-M to reduce the effect of such capacitance on the frequency response of the distributed amplifier 500.

The design of the integrated circuit 501 shown in FIG. 5 is constrained by the desired input and output impedances of the two artificial transmission lines 512, 514, which make up a transversal filter. The delays on lines 512, 514, should be approximately equal for input signals to arrive in phase at the output port. Moreover, to achieve a fast rise time the distributed amplifier 500 should have a broad bandwidth, requiring the cut-off frequencies of the lines 512, 514, to be greater than some minimum desired frequency.

The image impedance $Z_{oi}$ and cut-off frequency $F_{ci}$ of the "ith" stage of the distributed amplifier 500 is represented mathematically as:

$$Z_{oi} = \sqrt{\frac{L_i}{C_i}}, \text{ and} \tag{3}$$

$$F_{ci} = \frac{1}{\pi} \sqrt{\frac{1}{L_i * C_i}}. \tag{4}$$

It is noted from equations (1) and (2), that $Z_{oi}$ and $F_{ci}$ are functions of the capacitance $C_i$ at nodes 510a-N. Thus, by inserting current sources 506a-M into the output transmission line 512 at each node 510a-N, the corner frequency $F_{ci}$ and output image impedance $Z_{oi}$ will change. Since it is desirable to maintain a fixed corner frequency $F_{ci}$ and output image impedance $Z_{oi}$ at each node 510a-N to achieve desired transversal filter characteristics, the gain devices 504a-N of the distributed amplifier 500 can be made smaller in size to maintain the desired capacitance $C_i$, and therefore the same image impedance $Z_{oi}$ and corner frequency $F_{ci}$. For example, in one embodiment one could make the gain devices 504a-N in the distributed amplifier 500 about two-thirds of their normal size. Unfortunately, reducing the size of the gain devices 504a-N results in less gain and output swing from the distributed amplifier 500

The reduced gain and output swing cannot be fixed by simply adding more sections (e.g., gain devices) to the distributed amplifier 500 because for any distributed amplifier design there is an optimal number of sections (e.g., usually about six to nine), which is determined primarily by losses down the input transmission line 514. Also, the extra conductance contributed by the current sources 506a-M only add to the gain roll-off along the output transmission line 512. While reducing the size of the gain devices 504a-N may be adequate for some applications, there are other applications where more output power and gain with less gain roll-off is desired. Thus, a new topology is needed that enables the integration of the distributed current source 502 into the distributed amplifier 500 without having to reduce the size of the gain devices 504a-N in the distributed amplifier 500 to accommodate the additional capacitances contributed by the current sources 506a-M in the distributed current source 502.

In one embodiment of the present invention, the reduced output swing limitation is resolved by fixing the size of the gain devices 504a-N. To fix the size of the gain devices 504a-N, one can add extra lossless delay sections to the current sources 506a-M so that the current sources 506a-M and gain devices 504a-N need not attach to the same nodes (e.g., nodes 510a-N). The use of delay sections in the output and input transmission lines 512, 514, is described more fully with respect to FIG. 6 below.

Adding Lossless Delay Sections To Maintain Equal Phase Delays

Figure 6:
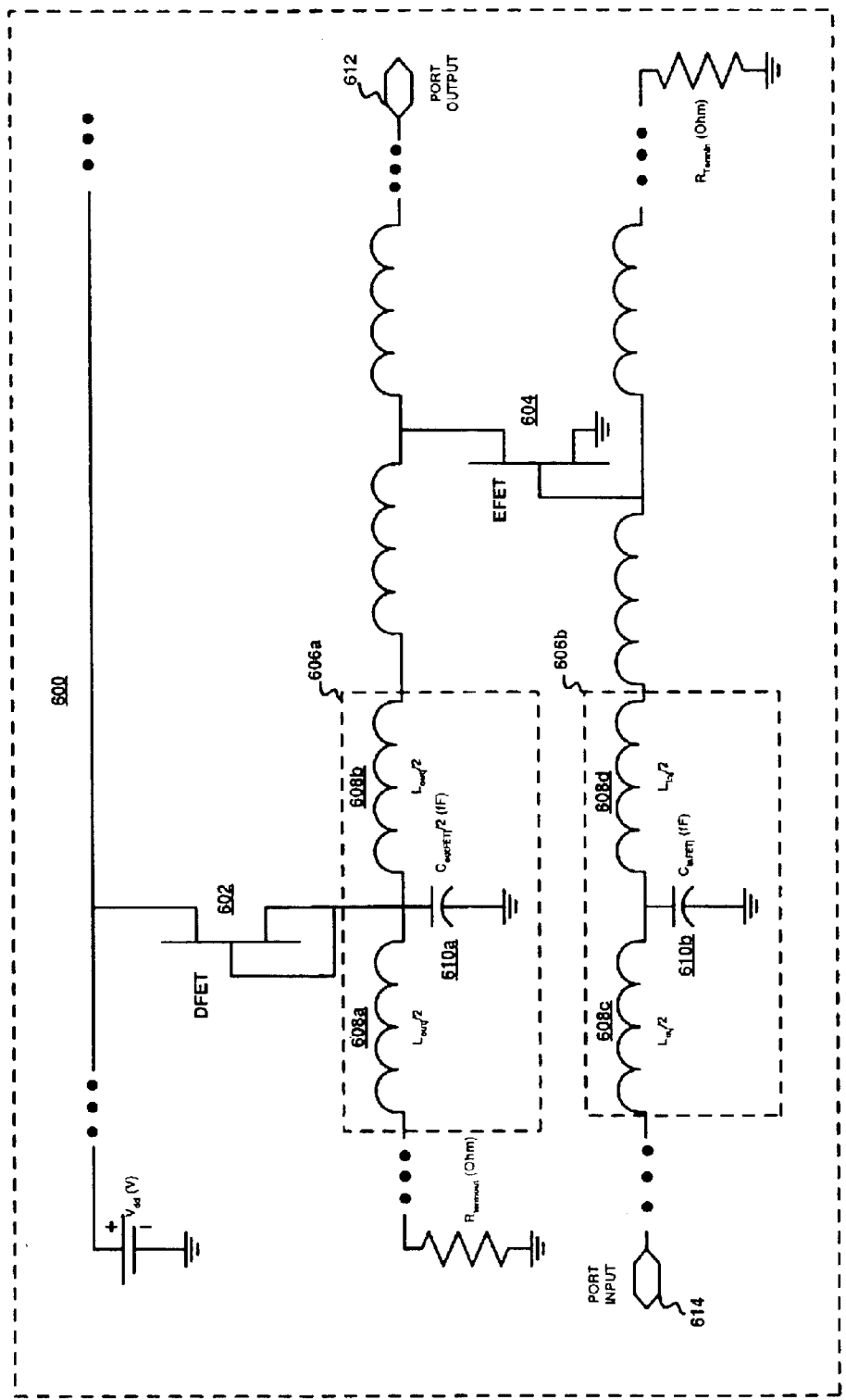
FIG. 6 is a circuit diagram of a "jth" section of an N section distributed amplifier with a current source and a lossless delay section added to provide output bias and maintain equal phase delays, in accordance with one embodiment of the present invention.

FIG. 6 is a circuit diagram of the "jth" section 600 of an N section distributed amplifier, including a current source 602, a gain device 604 and lossless delay sections 606a–b, in accordance with one embodiment of the present invention. The delay section 606a includes inductor elements 608a, 608b, and capacitor 610a. The delay section 606b includes inductors 608c, 608d, and capacitor 610b. The current source 602 is connected to the output transmission line 612 and the gain device 604 is connected to both the output transmission line 612 and the input transmission line 614. In one embodiment, the current source 602 is a D-type, active pull-up device (half the width) and provides bias current to the gain device 604.

The delay sections 606a–b are added to each current source 602 inserted into the transmission lines 612, 614, to maintain equal phase delays on the transmission lines 612, 614. The capacitor 610a is connected to the current source 602 to match the output capacitance of the gain device 604 ($C_{outj}/2$). The inductor elements 608a, 608b, are approximately equal to the output inductance $L_{outj}$ of the output image line filter ($L_{outj}$)/2, and the capacitor 610b is approximately equal to the input capacitance of the gain device 604 ($C_{inFETj}$). The inductor elements 608c and 608d are approximately equal to the input inductance of the input image line filter ($L_{outj}/2$).

The delay sections 606a–b shown in FIG. 6 provide one whole delay, while absorbing the parasitic capacitance contributed by the current source 602 into the output transmission line 612. By inserting the delay sections 606a–b into the output transmission line 612, a full-sized gain device 604 can be used in the distributed amplifier. In this way, the same performance can be achieved as from providing the bias through a conventional off-chip bias choke, except for extra losses along the output transmission line 612 due to the finite output conductance of the current source 602. As shown in FIG. 5, the current source 602 is preferably added before the gain device 604 to minimize such losses.

In another embodiment, the capacitor 610a is removed and the inductor elements 608a, 608b are selected to be approximately half the output inductance of the output image line filter ($L_{outj}/4$). Likewise, the capacitor 610b is selected to be approximately half the input capacitance ($C_{inFETj}/2$) of the gain device 604 and the inductors 608c, 608d, are selected to be approximately half the input inductance ($L_{inj}/4$) of the input image line filter. Such an embodiment is used in the distributed amplifier 702 described with respect to FIG. 7 below.

Figure 7:
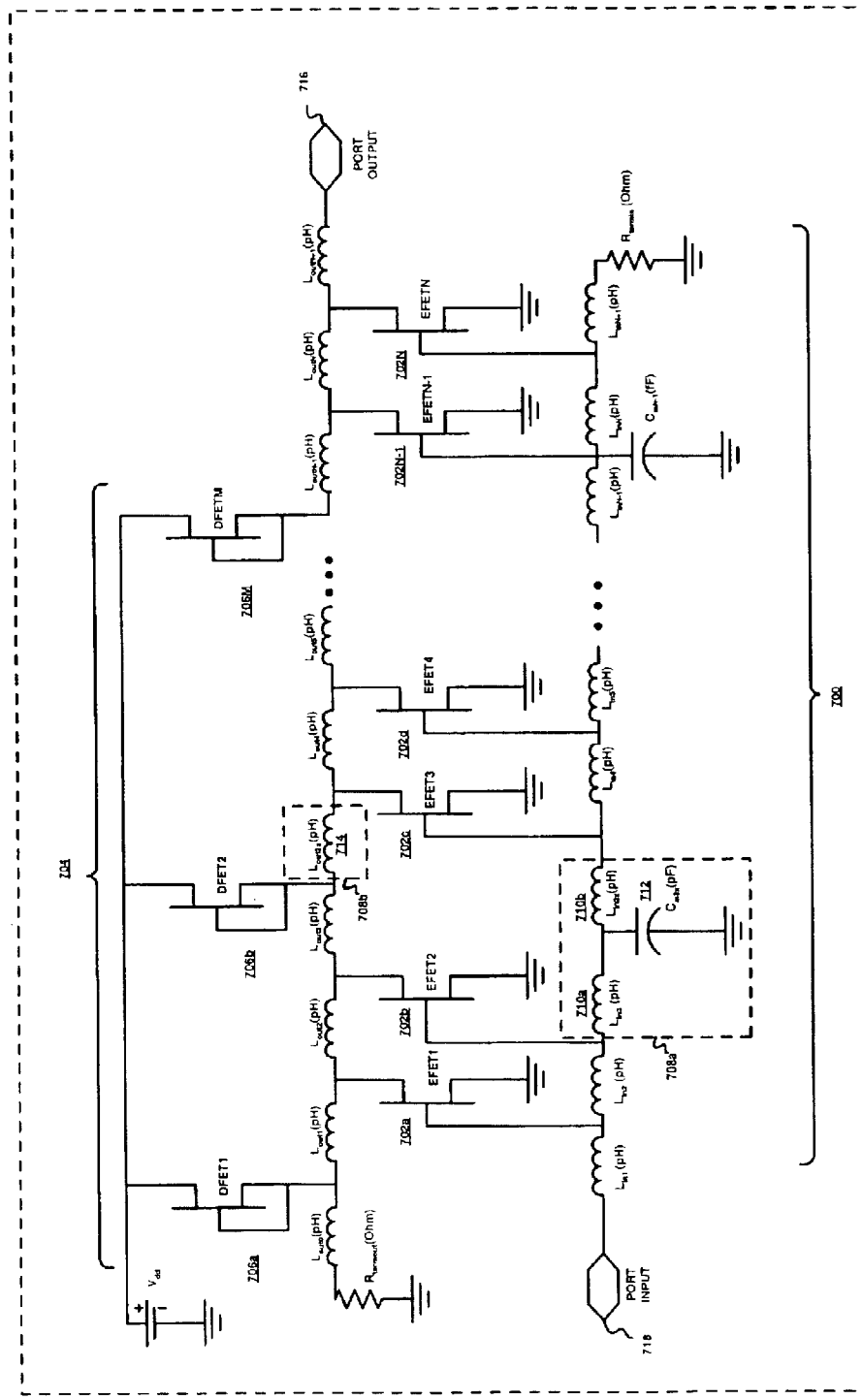
FIG. 7 is a diagram of an integrated circuit, including an N section distributed amplifier integrated with a distributed current source and lossless delay sections, in accordance with one embodiment of the present invention.

FIG. 7 is a circuit diagram of an N section distributed amplifier 700, including gain devices 702a-N integrated with a distributed current source 704 including current sources 706a-M, in accordance with one embodiment of the present invention. Lossless delay sections 708a–b are added for every two gain devices 702a-N to provide output bias and maintain equal phase delays. The current sources 706a-M can be, for example, a D-type active pull-up current sources.

The delay section 708a comprises inductor elements 710a–b and shunt capacitor 712, which are inserted in the input transmission line 718 for every two gain devices 702a-N. The delay section 708b includes inductor element 714, which is inserted in the output transmission line 716 for every two gain devices 702a-N. The inductor element 714 is approximately equal to the average of the other inductor elements $L_{out}$ inserted in the output transmission line 716. Likewise, the shunt capacitor 712 is approximately equal to the average of the input capacitances of the gain devices 702a-N on either side of the shunt capacitor 712, and the inductor element 710a–b are approximately equal to the average of the inductor elements $L_{in}$ inserted in the input transmission line 718 either side of the inductor element 710. Adding the capacitor 712 and inductor elements 710a–b to the input transmission line 718 and the inductor element 714 (and optionally a capacitor as shown in FIG. 6) to the output transmission line 716 maintains the desired matched phase delays on the transmission lines 716 and 718.

In each of the previous two embodiments of distributed current sources for both the ED MOS gate style with a depletion load for each gain device (FIG. 5) as well as the interleaved current source with extra phase-compensating filter elements (FIG. 7), the final performance of the distributed amplifier is dependant on the quality of the current sources. The following section describes several embodiments of current sources that can be integrated with a distributed amplifier, in accordance with the present invention.

Active Current Sources

The active current sources that can be realized on chip have several non-ideal properties. For example, a practical active current source has parasitic capacitance, which can only be absorbed up to the amount of capacitance present at each node of the output transmission line where the current source is inserted. As discussed previously with respect to FIG. 4, this capacitance is constrained by the image impedance $Z_i$ and cut-off frequency $F_c$ for the "ith" section of the distributed amplifier.

A practical active current source also has finite output conductance. The attenuation factor $\alpha_0$ down the output transmission line is approximately $$\alpha_0 = (1/(2*l))*Z_{io}*(G_{CS}+G_{gq}), \quad (5)$$

where the length l is the length of a unit section of the output transmission line, $Z_{io}$ is the characteristic impedance of the output transmission line, and $G_{cs}$ and $G_{gq}$ are the output conductances of the current source and the gain transistor, respectively. The losses along the output transmission line due to the attenuation factor $\alpha_0$ reduce both the gain and the output power of the distributed amplifier.

An active current source also has a limited amount of output current because there is a maximum current $I_{max}$, which a given size device can supply. Therefore, any current source constructed with this kind of device will only be able to source a finite amount of current $I_{CS}$, which is less than $I_{max}$.

A practical active current source also has a limited range of voltage swing. It behaves as a current source when the voltage drop across it is greater than its knee voltage $V_{knee}$. Below $V_{knee}$ the current source behaves like a resistor with its output current depending on the voltage applied across it. At higher applied voltages across the current source, the output conductance $G_{CS}$ increases abruptly near the breakdown voltage $V_{bd}$ of the current source.

The output conductance of an active current source is non-linear, which leads to more distortion when using the distributed amplifier in a linear mode. Besides the curvature to the current-voltage (I-V) plot from the transition near $V_{knee}$ and also towards the higher voltages as you approach $V_{bd}$, there can also be kinks due to traps and other non-linearities.

Several embodiments of current sources that take into account the above characteristics of practical current sources are discussed below with respect to FIGS. 8 and 9.

Complementary P-Type Current Mirror Style Current Sources

Figure 8B:
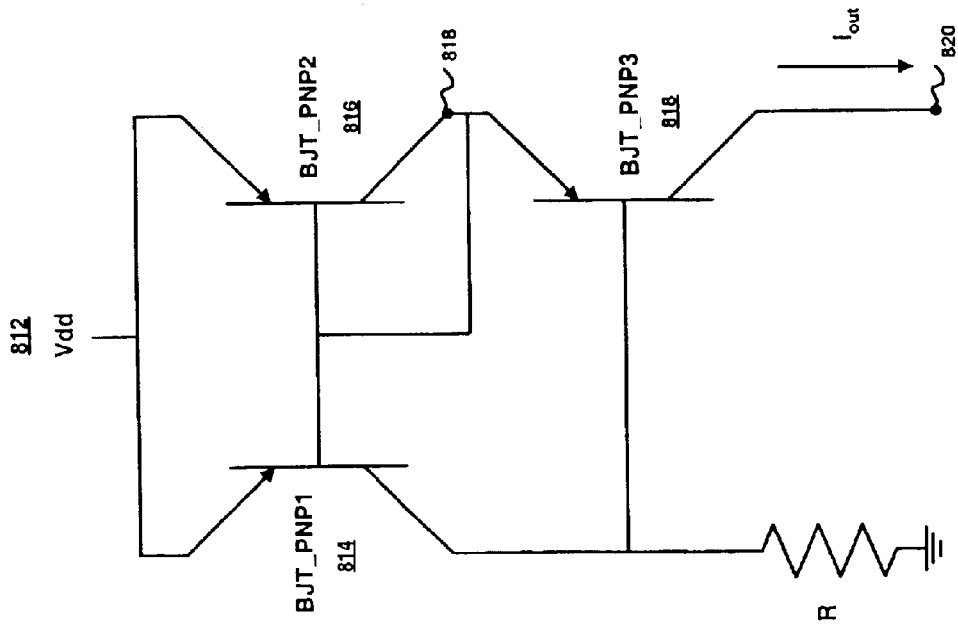
FIGS. 8A and 8B are circuit diagrams of complementary P-type current mirror style current sources for use in a distributed current source, in accordance with the present invention.
Figure 8A:
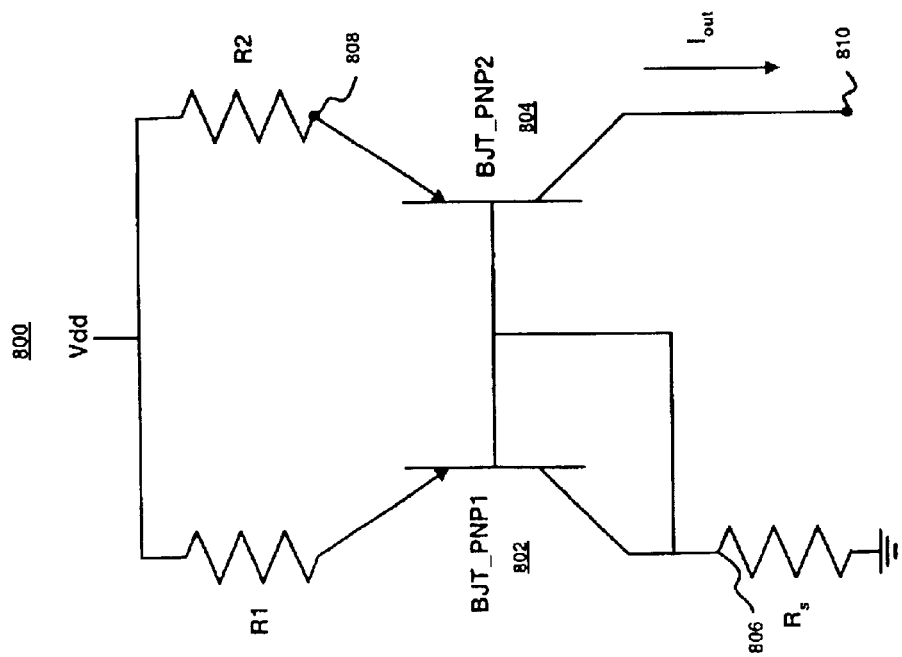

FIGS. 8A and 8B are circuit diagrams of two current source topologies implemented with complimentary-type devices that can be integrated with a distributed amplifier, in accordance with the present invention. With complementary devices, the output current $I_{out}$ is typically supplied out of an isolated node (e.g., a drain, a collector, etc.). This helps to keep the current constant regardless of the voltage applied across it.

FIG. 8A shows a current mirror 800 comprising transistors 802, 804, and a small series feedback resistor 806 ($R_s$). Adding the feedback resistor 806 helps to keep the output current $I_{out}$ constant over IC process variations. The current source 800 has a control node 808 for controlling the output current $I_{out}$. The control node 808 isolated from the output node 810 of the transistor 804, so the applied voltage at control node 808 does not effect the output current $I_{out}$.

FIG. 8B shows a Wilson current source 812 constructed from transistors 812, 814, and 816. The Wilson current source 812 has lower output conductance $G_{CS}$ at low frequencies than the current mirror 800. At high frequencies, however, the current mirror 800 and Wilson current source 812 provide similar performance. The Wilson current source 812 also has less headroom due to an additional voltage drop across transistor 818.

The current mirror 800 and Wilson current source 812 shown in FIGS. 8A and 8B are implemented using PNP BJT current sources, but other IC processes can also be used to fabricate these current sources, including without limitation, PMOS and PJFET processes. If the IC process offers various complementary devices (e.g., n-type, p-type), then the faster complimentary device type (e.g., n-type) are preferably used for the gain devices in the distributed amplifier and the slower complementary device type (e.g., p-type) to construct the distributed current source.

Often there are no complementary devices available with the IC process offered by the typical foundry. Such is the case with most GaAs MESFET and pHEMT processes. In such cases, there are various current source topologies based solely on depletion mode FET devices, as described below with respect to FIGS. 9A–9F.

Depletion Mode Load Style Current Sources

FIGS. 9A–9F are circuit diagrams of various current source topologies based on depletion mode FET devices which can be integrated with a distributed amplifier, in accordance with the present invention. The basic current source 900 shown in FIG. 9A sources a fair amount of current for its capacitance (i.e., a favorable $I_{CS}/C_{CS}$). With its gate connected to its source, its control nodes 901a, 901b, are fixed so it has relatively high immunity to variations in applied voltage to its output node. This is equally true for the current sources 908 and 910, shown in FIGS. 9E and 9F. The current sources 900, 908, and 910, all have a fixed output current $I_{out}$ that depends on the current $I_{dss}$ of the IC process, which can vary significantly from wafer to wafer.

The current sources 902 and 906 shown in FIGS. 9B and 9D avoid this problem by enabling the output current $I_{out}$ to be adjusted by varying the voltage across the control nodes 903a, 903b, and control nodes 909a, 909b, respectively, to be varied at the price of susceptibility to variations in the output voltage. Capacitors 919, 921 ($C_{gs}$) can also be added to the current sources 902 and 906, respectively, to maintain a constant gate-to-source voltage at higher frequencies.

The current source shown in FIG. 9C uses a series negative feedback resistor 907 ($R_s$) to suppress oscillations, which helps keep the output current $I_{out}$ consistent over variations in $I_{dss}$ due to process variations. This same series feedback approach can be applied to the current sources 908, 910, shown in FIGS. 9E and 9F. However, when you drop voltage across the feedback resistor 907 to provide feedback you pinch off the device, resulting in a lower $I_{CS}/C_{CS}$. One way to get around this problem is to forward bias the transistor 923 as shown in FIG. 9D by using a forward biased diode 911 to supply a positive gate-to-source bias. By forward biasing the transistor 923, the current source 906 is able to source the most output current $I_{out}$ for a given device size.

One way to double the current for a given amount of capacitance, while also halving the conductance $G_{CS}$ and doubling the breakdown voltage $V_{bd}$, is to use a dual current source 908 having two transistors in series as shown in FIG. 9E. This dual current source 908, however, also doubles the knee voltage $V_{knee}$, so it requires a greater bias voltage, resulting in reduced efficiency. It also has half as sharp of $V_{knee}$ as a single current source leading to softer clipping, greater amplitude variation, and increased jitter.

All of the current sources shown in FIGS. 9A–F (other than the dual gate current source 908 shown in FIG. 9E) have a high output conductance $G_{CS}$ and so are not ideally suited for integrating into a distributed amplifier. The dual gate current source 908 has a little less current for a lower $I_{CS}/C_{CS}$ and also a higher $V_{knee}$ for a lower efficiency than the basic depletion load current sources. It has such a low amount of output conductance it can even be negative. As can be observed from equation (5), the negative output conductance $G_{CS}$ enhances the gain of the distributed amplifier by reducing the attenuation factor $\alpha_0$ down the output transmission line, as can be noted from equation (5).

Reducing Effective Current Source Capacitance

Figure 10:
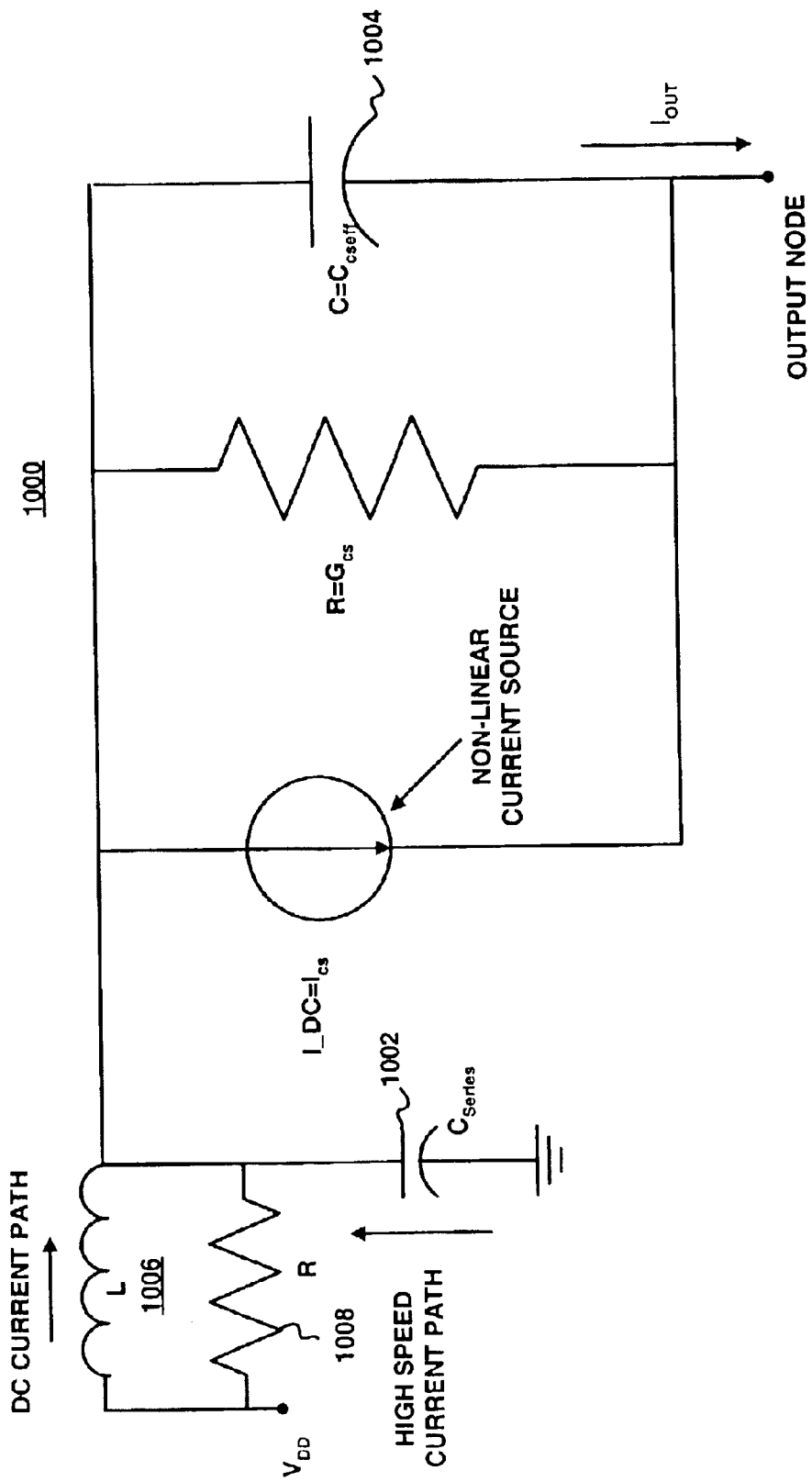
FIG. 10 is a diagram of an equivalent circuit for a current source having a series capacitor to reduce effective current source capacitance, in accordance with one embodiment of the present invention.

FIG. 10 is a diagram of an equivalent circuit of a current source 1000, including a series capacitor 1002 ($C_{series}$) to reduce the effective current source capacitance 1004 ($C_{cseff}$), in accordance with one embodiment of the present invention. The series capacitor 1002 can be applied to any of the current sources shown in FIGS. 8 and 9 to increase $I_{CS}/C_{CS}$. Adding the capacitor 1002 in series with the current source 1000 decreases the effective capacitance of the current source 1000. This technique works well in a small signal sense to reduce the effective current source capacitance 1004. To provide the dc current, a shunt RL network 1006 is used to provide the dc bias voltage $V_{dd}$. The value of resistor 1008 the RL network 1006 is selected so that it will recharge the series capacitor 1002 for all bit patterns in the input signal without shorting the series capacitor 1002. One embodiment of a distributed current source comprising current sources having series capacitors is described with respect to FIG. 11 below.

Six Section Distributed Current Source With Series Capacitor

Figure 11:
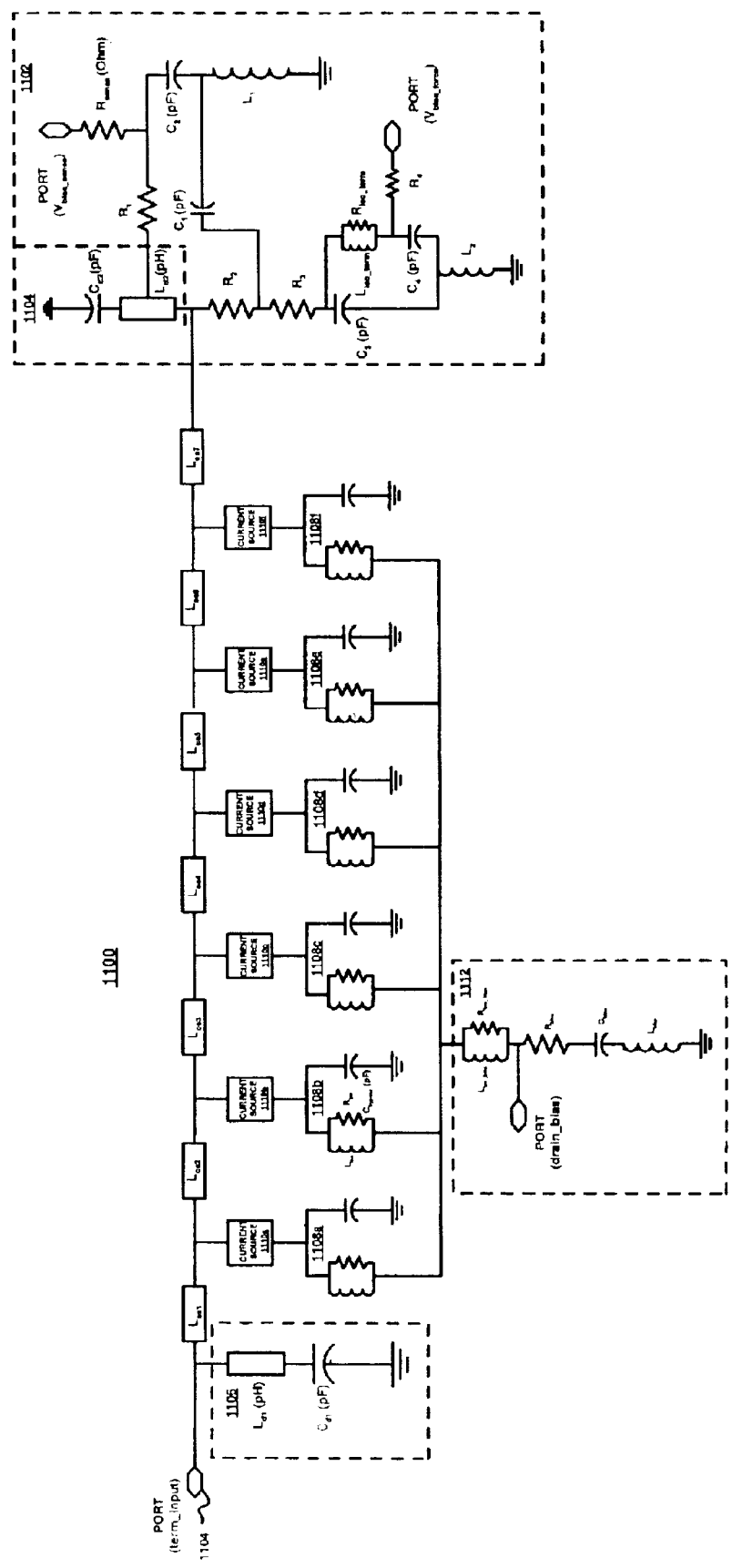
FIG. 11 is a diagram of an integrated circuit, including a distributed amplifier connected to a distributed current source output termination, in accordance with one embodiment of the present invention.

FIG. 11 is a circuit diagram of a six section distributed current source 1100, in accordance with one embodiment of the present invention. The distributed current source 1100 includes six $R_{sbias}$ feedback style current sources 1110a–e (e.g., the depletion mode load style current sources shown in FIGS. 9C and 9D), each connected to a series capacitor network 1108a–e comprising a shunt RL network ($R_{iso}$, $L_{iso}$) and a series bypass capacitor $C_{bypass}$, as described with respect to FIG. 10. The RL network ($R_{iso}$, $L_{iso}$) isolates off-chip circuitry from the current source 1100.

The RL bias network 1112 provides dc bias current while providing isolation from off-chip circuitry via $R_{bias}$ and $L_{bias}$. The inductor $L_{bias}$ is a backside via used to ground the capacitor $C_{bias}$, which is a chip bypassing capacitor for the drain bias. $R_{bias}$ is the bond wire resonance suppression resistor. The value of $R_{bias}$ can be determined as follows:

$$R_{bias} = 2\sqrt{L_{bondwire}/C_{bias}} \quad (6)$$

where $L_{bondwire}$ is the inductance of the bond wire. The shunt RL network ($R_{iso\_bias}$, $L_{iso\_bias}$) allows the bias current to flow through the inductor $L_{iso\_bias}$. The resistor $R_{iso\_bias}$ provides high frequency isolation between the bond wire and off-chip circuitry and the on-chip biasing current sources. The shunt RL network ($R_{iso\_bias}$, $L_{iso\_bias}$) allows the distributed current source to have consistent performance independent of the bond wire length off-chip.

When the bypass capacitors $C_{bypass}$ in the networks 1108a–f are large, the respective current sources 1110a–f reduce to standard distributed current source lines (e.g., FIG. 9C). When the bypass capacitors $C_{bypass}$ are about the same value as the capacitances $C_{CS}$ of the respective current sources 1110a–f, then the current sources 1110a–f reduce to series capacitors that reduce the effective capacitances of the current sources 1110a–f, as described with respect to FIG. 10.

The distributed current source 1100 includes M-derived inductor-capacitor (LC) matching sections 1104, 1106, located at opposite ends of the distributed current source 1100. The M-derived LC matching sections 1104, 1106, are used to transition from fixed reference impedance $Z_0$ (e.g., 50 Ohms), to the image impedance $Z_i$ of the artificial transmission line. The image impedance $Z_i$ is the impedance required to terminate an artificial transmission line as to have the same impedance as if the artificial transmission line was infinitely long. The image impedance $Z_i$ has strong frequency dependence near the cut-off frequency of the artificial transmission line. Using an M-derived termination with M=0.6, provides a near optimal matching circuit to match from the frequency dependent image impedance $Z_i$ to the fixed frequency reference impedance $Z_0$ of a constant impedance test environment. A further description of these techniques can be found in I.O. Zobel, "Theory and Design of Electric Wave Filters," Bell Sys. Tech. Jour., January 1923.

The image line filter of the distributed current source 1100 can be better matched at its ends by including the M-derived LC sections 1104, 1106. The M-derived LC section 1106 connected to the input of the distributed current source 1100 is optional, and provides impedance matching for testing and modeling. The M-derived LC section 1104 is connected to a frequency dependent termination network 1102 and adjusts the output bias current, as described more fully with respect FIG. 2.

The termination network 1102 embodiment of the circuits shown in FIGS. 12A–C. The network 1102 has high impedance at lower frequencies such that the shunt combination of the conductance of all the distributed current sources and the frequency dependent termination maintains a proper termination down to dc. At high frequencies, the capacitances of the distributed current sources will dominate, requiring lower termination impedance because the distributed current sources are behaving as a lossy artificial transmission line. The values for the active devices in the termination network 1102 (e.g., capacitors $C_1$, $C_2$, $C_3$, $C_4$ and inductors $L_1$, $L_2$) can be selected to provide the desired bandwidth for the frequency dependent termination network 1102. The port labeled $V_{bias\_sense}$ can be used to sense changes in the bias voltage and the port labeled $V_{bias\_force}$ can be used to adjust the bias voltage in response to any sensed changes, as previously described with respect to FIGS. 2 and 3.

At higher frequencies (e.g., above 2 GHz to 5 GHz), the termination network 1102 behaves like a lossy transmission line and wants to be terminated with $Z_i$ of the output transmission line 1114. At 30 KHz, which is close to dc, the current sources 1110a–f are no longer distributed and so the termination wants to be 15% to 35% higher, so that the sum of the conductances $G_{CS}$ of the current sources 1110a–f and the termination network 1102 equals $1/Z_i$ of the output transmission line 1114. Therefore, the optimal broadband termination impedance is frequency-dependant; that is, higher near dc and drops to $Z_i$ over several decades of bandwidth.

FIGS. 12A–C are circuit diagrams showing various resistor-capacitor (RC) networks with this kind of frequency response, in accordance with the present invention. FIG. 12A is a circuit diagram of a frequency dependent termination impedance star network comprising one or more series RC sections. FIG. 12B is a circuit diagram of a frequency dependent termination impedance ladder network comprising one or more RC ladder sections. FIG. 12C is a circuit diagram of a frequency dependent termination impedance combination network including both series and ladder RC sections. One or more of these RC networks can be used in the frequency dependent termination networks shown in FIGS. 2A, 2B, 3, and 11 as well as in the embodiments described below with respect to FIGS. 12–14. For example, any one of the circuits shown in FIGS. 12A–C can replace the fixed termination resistor 306 in FIG. 3 to provide a frequency dependent termination impedance.

Distributed Amplifier With Distributed Current Source Output Termination

Figure 13:
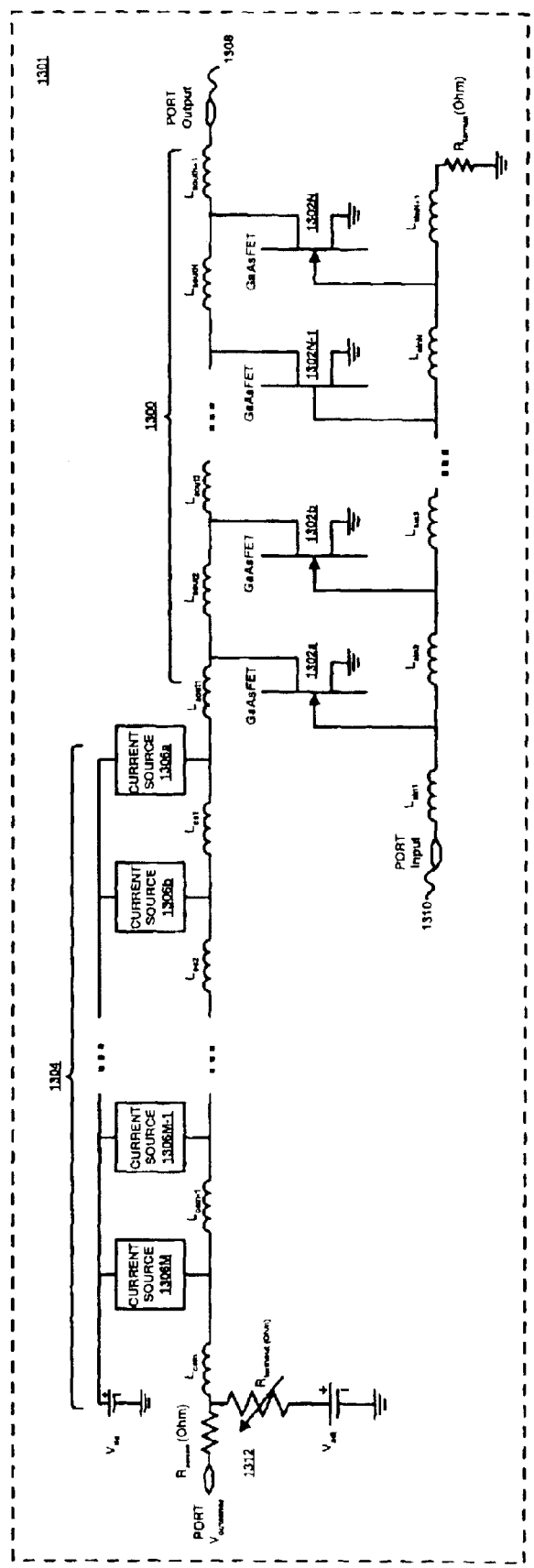
FIG. 13 is a circuit diagram of a six section distributed current source, in accordance with one embodiment of the present invention.

FIG. 13 is a circuit diagram of an integrated circuit 1301, including a distributed amplifier 1300 having an input transmission line 1310 and an output transmission line 1308, integrated with a distributed current source output termination network 1304, in accordance with one embodiment of the present invention. The distributed amplifier 1300 includes N sections of active gain devices 1302a-N. Each gain device 1302a-N has an output (e.g., drain) connected to the output transmission line 1308 and an input (e.g., gate) connected to the input transmission line 1310. Each active gain device 1302a-N is separated from its neighboring active gain device 1302a-N by an elemental inductance ($L_{aout}$) inserted in the output transmission line 1308 and an elemental inductance ($L_{ain}$) in the input line 1310. The elemental inductances $L_{aout}$, $L_{ain}$, provide equal phase delays on the output and input transmission lines 1308, 1310, as previously discussed with respect to FIGS. 6 and 7.

The current source output termination network 1304 comprises M current sources 1306a-M, each current source 1306a-M is connected to the output transmission line 1308 the distributed amplifier 1300 and separated from its neighboring current source 1306a-M by an elemental inductance $L_{csm}$. The current sources 1306a-M can be implemented with any of the current sources described with respect to FIGS. 8–9.

The output transmission line 1308 terminated with a frequency dependent termination impedance network 1312 comprising a reverse termination resistor $R_{termout}$ and a sense resistor $R_{sense}$ for monitoring the output bias voltage, as previously described with respect to FIGS. 2 and 3.

The current source output termination network 1304 solves the problems associated with having the current sources 1306a-M sharing the same output transmission line 1308 the distributed amplifier 1300 by placing the current sources 1306a-M in the back of the distributed amplifier 1300 in between the frequency dependent termination network 1312 and the output of the distributed amplifier 1300. In this way, the current sources 1306a-M form an active lossy transmission line, which provides dc bias and impedance termination to the output of the distributed amplifier 1300 at the same time. The shunt conductances $G_{CS}$ of the current sources 1306a-M no longer reduce the gain nor the output power of the distributed amplifier 1300. In fact, the loss helps to reduce the magnitude of the reflections off the reverse termination resistor $R_{termout}$ at higher frequencies.

Reducing Pattern Dependent Jitter

When a distributed current source is integrated with a distributed amplifier, the overall simulated performance of the combination compares favorably in all respects with the same distributed amplifier biased with a conventional ideal rf choke, except for extra bit pattern dependent jitter. There are at least two sources of this extra bit pattern dependent jitter. These include clipping the voltage at the distributed current source, which causes reflections that are spatially well separated from the output, and the extra bounce on the current sources provided by a series capacitor in the drain bias network.

In one embodiment of the present invention, one or more extra current sources are added near the output to clip the voltage on the top of the output waveform to reduce the extra jitter induced from saturating the distributed current source devices near the reverse termination. By using the knee voltages $V_{knee}$ of the current sources to clip the tops of the output waveform and the knee voltages of the gain devices to clip the bottoms of the output waveform, the amplitude of the output waveform can be kept more constant over variations in bit pattern. Two embodiments of this technique are described below with respect to FIGS. 14 and 15.

Figure 14:
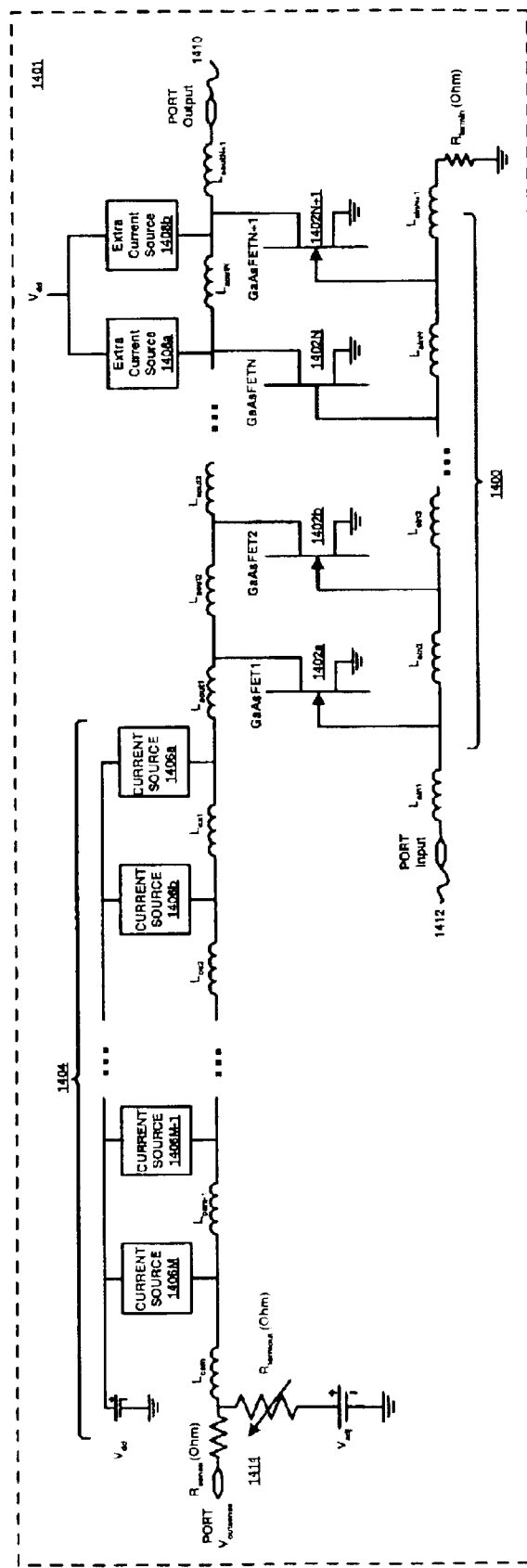
FIG. 14 is a diagram of an integrated circuit, including a distributed amplifier integrated with distributed current source termination with extra current sources added at the output, in accordance with one embodiment of the present invention.

FIG. 14 is a circuit diagram of an integrated circuit 1401, including a distributed amplifier 1400 integrated with a distributed current source termination network 1404 including extra current sources 1408a and 1408b, in accordance with one embodiment of the present invention. The topology shown in FIG. 14 is a variation of the topology shown in FIG. 11, whereby most of the current (e.g., 80–90%) is supplied from the distributed current source termination network 1402, as described with respect to FIG. 11, and the remainder is supplied from the extra current sources 1408a, 1408b, embedded in output transmission line 1410 of the distributed amplifier 1400, using the techniques for absorbing parasitic capacitance and maintaining equal phase delays described with respect to FIGS. 6 and 7.

The output transmission line 1410 is terminated with a frequency dependent termination impedance network 1414 comprising a reverse termination resistor $R_{termout}$ and a sense resistor $R_{sense}$ for monitoring the output bias voltage, as previously described with respect to FIGS. 2 and 3.

Figure 15:
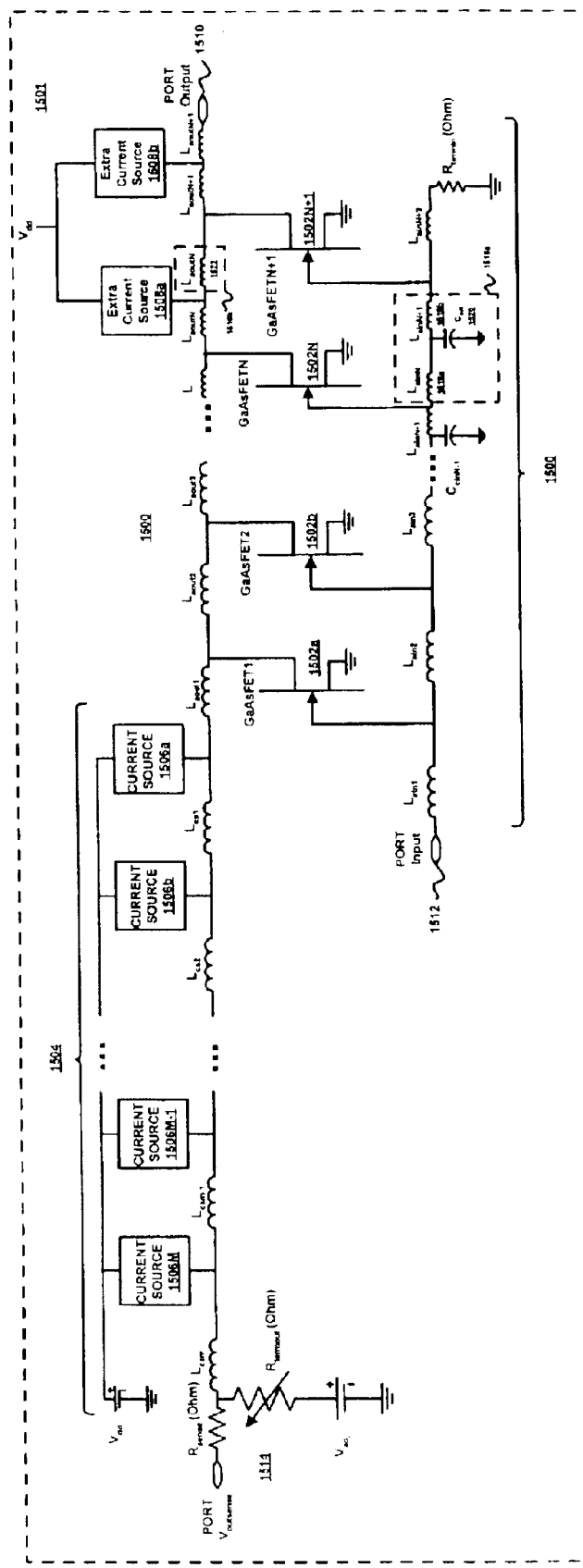
FIG. 15 is a diagram of an integrated circuit, including a distributed amplifier integrated with distributed current source termination with extra current sources added at the output and delay sections added to maintain equal phase delays, in accordance with one embodiment of the present invention.

FIG. 15 is a circuit diagram of an integrated circuit 1501, including a distributed amplifier 1500 integrated with a distributed current source termination network 1504 including extra current sources 1508a and 1508b, in accordance with one embodiment of the present invention. The topology shown in FIG. 15 is a variation of the topology shown in FIG. 14, and includes delay sections 1516a–b. The delay section 1516a is connected to the input transmission line 1512 of the distributed amplifier 1500, and includes inductor elements 1518a–b and shunt capacitor 1520. The delay section 1516b includes inductor element 1522 inserted in the output transmission line 1510. The delay sections 1516a–b are used to maintain equal phase delays between the output and input transmission lines 1510, 1512, as previously described with respect to FIGS. 6 and 7. The output transmission line 1510 is terminated with a frequency dependent termination impedance network 1514 comprising a reverse termination resistor $R_{termout}$ and a sense resistor $R_{sense}$ for monitoring the output bias voltage, as previously described with respect to FIGS. 2 and 3.

Using a Tee or Pi Attenuator To Reduce Jitter

Figure 16:
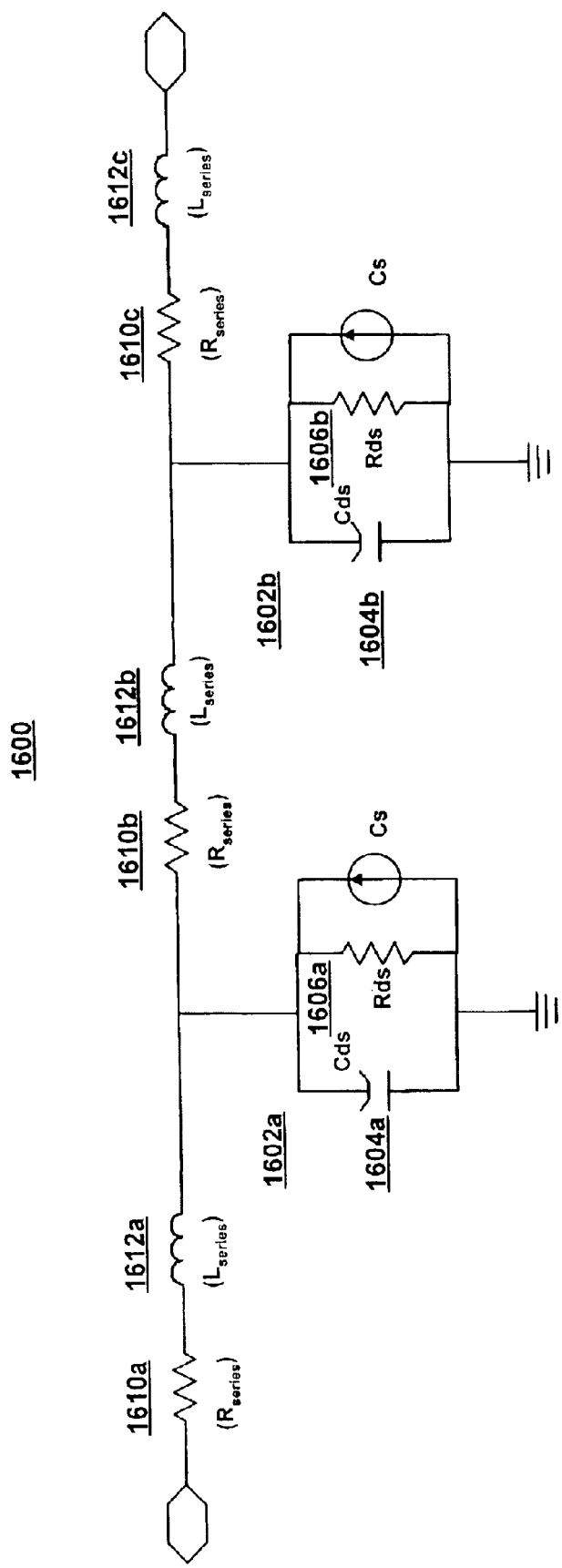
FIG. 16 is a circuit diagram of a distributed current source configured as a Tee or Pi attenuator, in accordance with one embodiment of the present invention.

FIG. 16 is a circuit diagram of a distributed current source 1600 configured as a Tee attenuator, in accordance with one embodiment of the present invention. The distributed current source 1600 includes two current sources 1602a–b. Each current source 1602a–b is modeled by a shunt capacitance 1604a–b ($C_{ds}$) and a shunt resistance 1606a–b ($R_{ds}$). Each current source 1608a–b is also connected in shunt with a series resistor 1610a–c ($R_{series}$), which is connected in series with a matching inductor 1612a–c ($L_{series}$). The input capacitances 1604a–c are compensated for by adding the series inductances 1612a–c to keep the characteristic impedance $Z_0$ constant. For a single current source, the characteristic impedance $Z_0$ can be represented mathematically as follows:

$$Z_0 = \sqrt{(R_{series} + jwL_{series})/(G_{ds} + jwC_{ds})}, \quad (7)$$

where $G_{ds}$ is the shunt conductance of the current source.

The configuration shown in FIG. 16 makes the shunt resistance of the current sources into attenuators, which reduces jitter when the distributed amplifier is driven into saturation. The distributed current source 1600 can include any number of gain devices and can also be configured as a pi attenuator.

Figure 17:
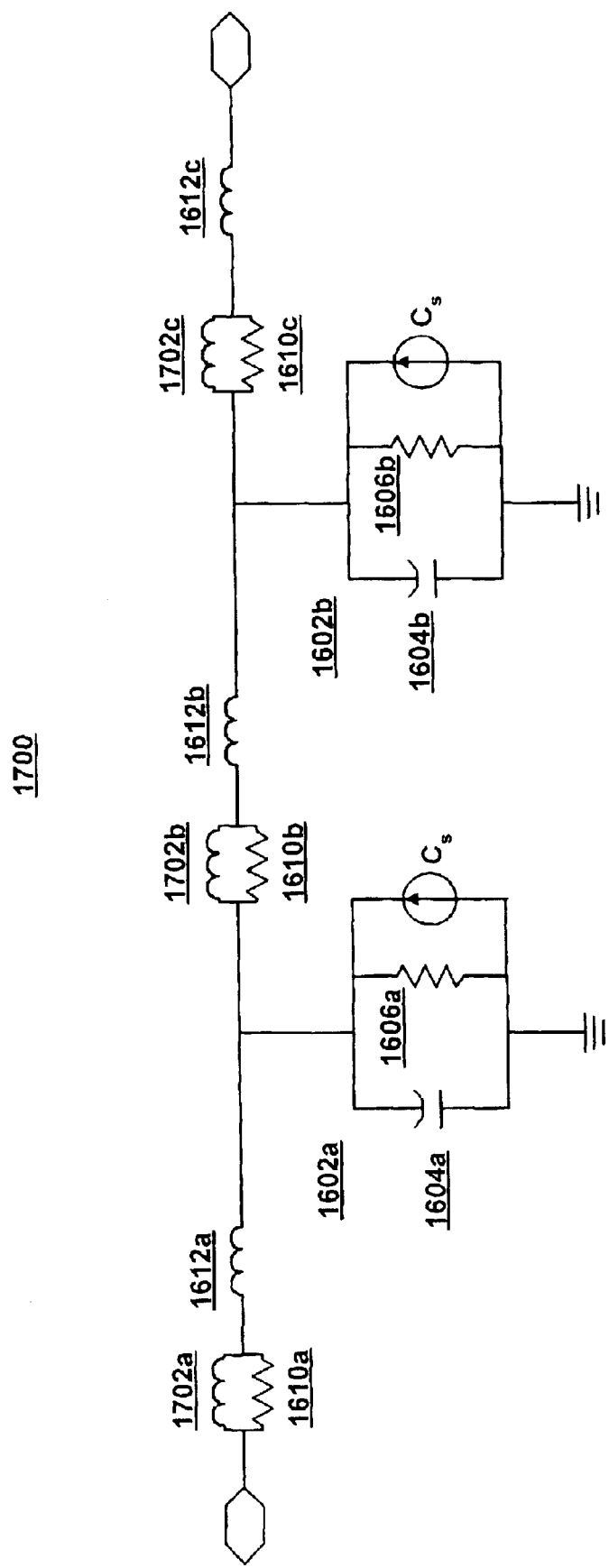
FIG. 17 is a circuit diagram of a distributed current source, which is the distributed current source shown in FIG. 16 modified to reduce bias dependence at high frequencies, in accordance with one embodiment of the present invention.

FIG. 17 is a circuit diagram of a distributed current source 1700, which is the distributed current source 1600 shown FIG. 16 modified to reduce bias dependence at high frequencies, in accordance with one embodiment of the present invention. The distributed current source 1700 is the same configuration as the distributed current source 1600 except for the addition of inductors 1702a–c connected in shunt with the series resistors 1610a–c. The added inductors 1702a–c shunt the series resistors 1610a–c at dc so that a voltage is not dropped across the series resistors 1610a–c.

The above description is included to illustrate the operation of the preferred embodiments and is not meant to limit the scope of the invention. Rather, the scope of the invention is to be limited only by the claims. From the above discussion, many variations will be apparent to one skilled in the relevant art that would yet be encompassed by the spirit and scope of the invention.

What is claimed is:

1. An integrated circuit device, comprising:
    an integrated circuit having input and output lines, the integrated circuit having one or more gain devices connected to the output line;
    a distributed current source connected to the integrated circuit and having at least one current source connected to the output line for biasing at least one gain device;
    a frequency dependent termination network connected to the output line, for providing the integrated circuit with a termination impedance; and
    a sensing device connected to the output line for sensing a change in bias voltage on the output line.

2. The device of claim 1, wherein the termination network includes a bias control loop connected to the output line for automatically adjusting the bias voltage on the output line.

3. The device of claim 1, furthering comprising:
    a delay section connected to the input line of the integrated circuit to control phase delay in the input line.

4. The device of claim 3, wherein the delay section includes an inductive element.

5. The device of claim 3, wherein the delay section includes a capacitive element.

6. The device of claim 1, further comprising:
a delay section connected to the output line of the distributed amplifier to control phase delay in the output line.

7. The device of claim 6, wherein the delay section includes an inductive element.

8. The device of claim 6, wherein the delay section includes a capacitive element.

9. The device of claim 1, further comprising:
a delay section connected to at least one of the input and output lines after every two gain devices.

10. The device of claim 1, wherein the current source has an output connected to a capacitive element for reducing capacitance contributed by the current source.

11. The device of claim 10, wherein the capacitive element is connected to a shunt resistor-inductor network for providing bias current.

12. The device of claim 1, wherein the termination network includes a frequency dependent termination impedance including a resistor-capacitor (RC) star network to compensate for parasitic conductance of the current source.

13. The device of claim 1, wherein the termination network includes a frequency dependent termination impedance including a resistor-capacitor (RC) ladder network to compensate for parasitic conductance of the current source.

14. The device of claim 1, wherein the termination network includes an M-derived matching inductor-capacitor (LC) section.

15. The device of claim 1, wherein the current source is a depletion mode style current source.

16. The device of claim 1, wherein the current source is connected to a resistive element for suppressing oscillations in output current due to process variations.

17. The device of claim 1, wherein the current source uses negative conductance to compensate for losses along the output line.

18. The device of claim 1, wherein the current source includes at least one M-derived matching section.

19. The device of claim 1, wherein the current source is connected in shunt with at least one inductive element, which is connected to at least one resistive element to reduce jitter if one or more gain devices is run in saturation.

20. The device of claim 19, wherein the resistive element is connected in shunt with an inductive element to prevent a voltage from being dropped across the resistor at a predetermined frequency.

21. The device of claim 1, further comprising:
a resistor-capacitive (RC) network connected in shunt to the current source to increase attenuation along a current bias line connecting the current source to the output line.

22. The device of claim 1, wherein the output line includes resistive material to increase loss along a current bias line connecting the current source to the output line.

23. The device of claim 1, wherein the integrated circuit is a distributed amplifier and the distributed current source is integrated with the distributed amplifier.

24. The device of claim 1, wherein the current source comprises:
a transistor having gate and source terminals; and
at least one resistor connected between the gate and source terminals for suppressing oscillations in the bias current.

25. The device of claim 1, wherein the current source comprises:
a transistor having gate and source terminals;
at least one resistor connected between the gate and source terminals;
a capacitor connected in shunt with the resistor to maintain a constant voltage across the gate and source terminals; and
a current adjustment mechanism for adjusting the voltage across the gate and source terminals.

26. An integrated circuit device, comprising:
an integrated circuit having input and output lines, the integrated circuit having one or more gain devices connected to the output line; and
a termination network connected to the output line, the termination network comprising:
at least one current source connected to the output line for biasing at least one of the gain devices; and
a sensing device connected to the output line for sensing a change in output bias voltage on the output line.

27. The device of claim 26, wherein the termination network includes a bias control loop connected to the output line for automatically adjusting the output bias voltage on the output line.

28. The device of claim 26, wherein the current source is connected in shunt with at least one inductive element, which is connected in series with at least one resistive element to reduce jitter if one or more gain devices are run in saturation.

29. The device of claim 28, wherein the resistive element is connected in shunt with an inductive element to prevent a voltage from being dropped across the resistive element at predetermined frequencies.

30. The device of claim 26, wherein the current source has an output connected to a capacitive element for reducing capacitance contributed by the current source.

31. The device of claim 30, wherein the capacitive element is connected to a shunt resistor-inductor network for providing bias current.

32. The device of claim 26, wherein the termination network includes a frequency dependent termination impedance including a resistor-capacitor (RC) star network to compensate for parasitic conductance of the current source.

33. The device of claim 26, wherein the termination network includes a frequency dependent termination impedance including a resistor-capacitor (RC) ladder network to compensate for parasitic conductance of the current source.

34. The device of claim 26, wherein the termination network includes an M-derived matching inductor-capacitor (LC) section.

35. The device of claim 26, wherein the current source is a depletion mode style current source.

36. The device of claim 26, wherein the current source is connected to a resistive element for suppressing oscillations in output current due to process variations.

37. The device of claim 26, wherein the current source uses negative conductance to compensate for losses down the output line.

38. The device of claim 26, wherein the current source includes at least one M-derived matching section.

39. The device of claim 26, wherein the current source is connected in shunt with at least one inductive element, which is connected to at least one resistive element to reduce jitter if one or more gain devices are run in saturation.

40. The device of claim 39, wherein the resistive element is connected in shunt with an inductive element to prevent a voltage from being dropped across the resistive element at predetermined frequencies.

41. The device of claim 26, further comprising:
a resistor-capacitive (RC) network connected in shunt to the current source to increase attenuation along a current bias line for connecting the current source with the output line.

42. The device of claim 26, wherein the output line includes resistive material to increase loss along a current bias line connecting the current source to the output line.

43. The device of claim 26, wherein the integrated circuit is a distributed amplifier.

44. The device of claim 26, wherein the current source comprises:
a transistor having gate and source terminals; and
at least one resistor connected between the gate and source terminals for suppressing oscillations in the bias current.

45. The device of claims 26, wherein the current source comprises:
a transistor having gate and source terminals;
at least one resistor connected between the gate and source terminals;
a capacitor connected in shunt with the resistor to maintain a constant voltage across the gate and source terminals; and
a current adjustment mechanism for adjusting the voltage across the gate and source terminals.

46. An integrated circuit device, comprising:
an integrated circuit having input and output lines, the integrated circuit having one or more gain devices connected to the output line;
a distributed current source connected to the integrated circuit and having at least one current source connected to the output line for biasing at least one of the gain devices; and
a termination network connected to the output line, the termination network comprising:
at least one current source connected to the output line for providing bias to at least one gain device; and
a sensing device connected to the output line for sensing a change in output bias voltage on the output line.

47. The device of claim 46, wherein the termination network includes a bias control loop connected to the output line for automatically adjusting the output bias voltage on the output line.

48. The device of claim 46, further comprising:
a delay section connected to the input line of the distributed amplifier to control phase delay in the input line.

49. The device of claim 48, wherein the delay section includes an inductive element.

50. The device of claim 48 wherein the delay section includes a capacitive element.

51. The device of claim 46, further comprising:
a delay section connected to the output line of the distributed amplifier to control phase delay in the output line.

52. The device of claim 51, wherein the delay section includes an inductive element.

53. The device of claim 51, wherein the delay section includes a capacitive element.

54. The device of claim 46, further comprising:
a delay section connected to at least one of the input and output lines after every two gain devices.

55. The device of claim 46, wherein the current source includes a capacitive element for reducing capacitance contributed by the current source.

56. The device of claim 55, wherein the capacitive element is connected to a shunt resistor-inductor network for providing bias current.

57. The device of claim 46, wherein the termination network includes a frequency dependent termination impedance including a resistor-capacitor (RC) star network to compensate for parasitic conductance of the current source.

58. The device of claim 46, wherein the termination network includes a frequency dependent termination impedance including a resistor-capacitor (RC) ladder network to compensate for parasitic conductance of the current source.

59. The device of claim 46, wherein the termination network includes an M-derived matching inductor-capacitor (LC) section.

60. The device of claim 46, wherein the current source is a depletion mode style current source.

61. The device of claim 46, wherein the current source is connected to a resistive element for suppressing oscillations in output current due to process variations.

62. The device of claim 46, wherein the current source uses negative conductance to compensate for losses down the output line.

63. The device of claim 46, wherein the current source includes at least one M-derived matching section.

64. The device of claim 46, wherein the current source is connected in shunt with at least one inductive element, which is connected to at least one resistive element to reduce jitter if one or more gain devices are run in saturation.

65. The device of claim 64, wherein the resistive element is connected in shunt with an inductive element to prevent a voltage from being dropped across the resistive element at predetermined frequencies.

66. The circuit of claim 46, further comprising:
a resistor-capacitive (RC) network connected in shunt to the current source to increase attenuation along a current bias line for connecting the current source with the output line.

67. The circuit of claim 46, wherein the output line includes resistive material to increase loss along a current bias line for connecting the current source with the output line.

68. The device of claim 46, wherein the current source comprises:
a transistor having gate and source terminals; and
at least one resistor connected between the gate and source terminals for suppressing oscillations in the bias current.

69. The device of claim 46, wherein the current source comprises:
a transistor having gate and source terminals;
at least one resistor connected between the gate and source terminals;
a capacitor connected in shunt with the resistor to maintain a constant voltage across the gate and source terminals; and
a current adjustment mechanism for adjusting the voltage across the gate and source terminals.

70. The device of claim 46, wherein the integrated circuit is a distributed amplifier and the distributed current source is integrated with the distributed amplifier.

71. A circuit for biasing and terminating one or more integrated circuits, comprising:
a plurality of current sources connected to a transmission line, each current source having an output terminal for providing biasing current;

a bypassing capacitor connected to the output terminal of each current source;

a resistor-inductor (RL) network connected in shunt with the bypassing capacitor; and a termination network connected to the transmission line, the termination network comprising:

a sensing device connected to the transmission line for sensing a change in output bias voltage on the transmission line.

72. The circuit of claim 71, wherein the current source is a depletion mode style current source.

73. The circuit of claim 71, wherein the current source is connected to a resistive element for suppressing oscillations in output current due to process variations.

74. The circuit of claim 71, wherein the current source uses negative conductance to compensate for losses down the transmission line.

75. The circuit of claim 71, wherein the termination network includes at least one M-derived matching section.

76. The circuit of claim 71, wherein at least one current source comprises:

a transistor having gate and source terminals; and at least one resistor connected between the gate and source terminals for suppressing oscillations in the bias current.

77. The circuit of claim 71, wherein at least one current source comprises:

a transistor having gate and source terminals;

at least one resistor connected between the gate and source terminals;

a capacitor connected in shunt with the resistor to maintain a constant voltage across the gate and source terminals; and a current adjustment mechanism for adjusting the voltage across the gate and source terminals.

* * * * *